(12) United States Patent
Wallner et al.

(10) Patent No.: US 8,569,840 B2
(45) Date of Patent: Oct. 29, 2013

(54) BIPOLAR TRANSISTOR INTEGRATED WITH METAL GATE CMOS DEVICES

(75) Inventors: Thomas A. Wallner, Pleasant Valley, NY (US); Ebenezer E. Eshun, Newburgh, NY (US); Daniel J. Jaeger, Wappingers Falls, NY (US); Phung T. Nguyen, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/370,523

(22) Filed: Feb. 10, 2012

(65) Prior Publication Data

US 2012/0139056 A1 Jun. 7, 2012

Related U.S. Application Data

(62) Division of application No. 12/556,205, filed on Sep. 9, 2009, now Pat. No. 8,129,234.

(51) Int. Cl.
*H01L 29/70* (2006.01)
*H01L 29/73* (2006.01)
*H01L 29/78* (2006.01)

(52) U.S. Cl.
USPC .............. 257/378; 257/592; 257/E21.696

(58) Field of Classification Search
CPC ........... H01L 29/0657; H01L 21/8249; H01L 29/1004
USPC .................... 257/378, 592, E21.696
See application file for complete search history.

(56) References Cited

U.S. PATENT DOCUMENTS

| | | | |
|---|---|---|---|
| 5,508,537 A * | 4/1996 | Imai | 257/197 |
| 6,399,993 B1 | 6/2002 | Ohnishi et al. | |
| 6,940,151 B2 | 9/2005 | Carroll et al. | |
| 7,932,541 B2 * | 4/2011 | Joseph et al. | 257/198 |
| 2002/0197809 A1 * | 12/2002 | Asai et al. | 438/312 |
| 2003/0157774 A1 | 8/2003 | Tominari et al. | |
| 2005/0242373 A1 * | 11/2005 | Ahlgren et al. | 257/197 |

* cited by examiner

*Primary Examiner* — Jerome Jackson, Jr.
*Assistant Examiner* — Paul Budd
(74) *Attorney, Agent, or Firm* — Scully, Scott, Murphy & Presser, P.C.; H. Daniel Schnurmann

(57) ABSTRACT

A high-k gate dielectric layer and a metal gate layer are formed and patterned to expose semiconductor surfaces in a bipolar junction transistor region, while covering a CMOS region. A disposable material portion is formed on a portion of the exposed semiconductor surfaces in the bipolar junction transistor area. A semiconductor layer and a dielectric layer are deposited and patterned to form gate stacks including a semiconductor portion and a dielectric gate cap in the CMOS region and a cavity containing mesa over the disposable material portion in the bipolar junction transistor region. The disposable material portion is selectively removed and a base layer including an epitaxial portion and a polycrystalline portion fills the cavity formed by removal of the disposable material portion. The emitter formed by selective epitaxy fills the cavity in the mesa.

20 Claims, 19 Drawing Sheets

BIPOLAR TRANSISTOR INTEGRATED WITH METAL GATE CMOS DEVICES

CROSS REFERENCE TO RELATED APPLICATION

This application is a divisional of U.S. patent application Ser. No. 12/556,205, filed Sep. 9, 2009 the entire content and disclosure of which is incorporated herein by reference.

BACKGROUND

The present invention relates to semiconductor devices, and particularly to bipolar complementary metal-oxide-semiconductor (BiCMOS) integrated structures including a bipolar transistor having a self-aligned base formed by selective epitaxy and complementary metal-oxide-semiconductor (CMOS) devices having a metal gate and a high-k gate dielectric and methods of manufacturing the same.

One of the key technological innovations for improving performance of CMOS devices has been the introduction of high dielectric constant (high-k) dielectric materials for the gate dielectric of field effect transistors. The high-k dielectric materials include dielectric metal oxides that have a dielectric constant greater than 3.9, which is the dielectric constant of silicon oxide. Typically, such high-k dielectric materials have a dielectric constant greater than 7.5.

Performance of advanced CMOS transistors is further enhanced by employing a metal gate, which refers to a gate electrode including a metal layer, i.e., a layer of an elemental metal or an intermetallic compound that is not an alloy of silicon. The metal gate increases the conductive of the gate electrode of a transistor so that the RC delay of the gate electrode is reduced compared with a gate electrode employing a doped semiconductor material and/or a metal-semiconductor alloy such as a silicide.

Use of a high-k gate dielectric and/or a metal gate introduces tremendous difficulties in integration with bipolar devices because the patterning of the high-k dielectric material requires dedicated patterning processes that are not compatible with existing processes for manufacturing a bipolar junction transistor. Additional processing steps introduced to enable integration of bipolar junction transistors with CMOS devices employing a high-k gate dielectric and/or a metal gate tend to drive up the complexity of the overall processing sequence and the cost of manufacturing BiCMOS devices. Manufacturable integration schemes for BiCMOS devices including a high-k gate dielectric and/or a metal gate require a minimal number of additional processing steps.

BRIEF SUMMARY

In an embodiment of the present invention, a high-k gate dielectric layer and a metal gate layer are formed and patterned to expose semiconductor surfaces in a bipolar junction transistor region, while covering a CMOS region. A disposable material portion is formed on one of the exposed semiconductor surfaces, which is a surface of a semiconductor region that is surrounded by a shallow trench isolation structure in the bipolar junction transistor area. A semiconductor layer and a dielectric layer are deposited and patterned to form gate stacks including a semiconductor portion and a dielectric gate cap in the CMOS region and a cavity containing mesa over the disposable material portion in the bipolar junction transistor region. The disposable material portion is selectively removed and a base layer including an epitaxial portion and a polycrystalline portion fills the cavity formed by removal of the disposable material portion. The emitter formed by selective epitaxy fills the cavity in the mesa. The feedthrough to a subcollector layer may be provided by the same ion implantation as the source/drain ion implantation.

According to an aspect of the present invention, a method of forming a semiconductor structure is provided, which comprises:

forming a high dielectric constant (high-k) dielectric material layer having a dielectric constant greater than 3.9 on a surface of a semiconductor layer;

removing the high-k dielectric layer from a portion of the surface of the semiconductor layer and forming a disposable material portion on the portion of the surface of the semiconductor layer;

forming a semiconductor material layer and a dielectric cap material layer over the high-k dielectric material layer and the disposable material layer;

patterning the dielectric cap material layer and the semiconductor material layer to form at least one gate stack and a mesa structure that laterally surrounds a cavity, wherein the at least one gate stack includes a portion of the high-k dielectric layer and the mesa structure comprises a remaining portion of the dielectric cap material layer and a remaining portion of the semiconductor material layer, and a top surface of the disposable material portion is exposed within the cavity;

expanding the cavity by removing the disposable material portion underneath the mesa structure to expose the top surface of the semiconductor layer; and growing an epitaxial base in a portion of the cavity by selective epitaxy.

According to another aspect of the present invention, a semiconductor structure is provided, which comprises:

at least one metal-oxide-semiconductor (MOS) transistor located on a first portion of a semiconductor substrate, the at least one MOS transistor including a high dielectric constant (high-k) gate dielectric having a dielectric constant greater than 3.9; and a bipolar junction transistor (BJT) located on a second portion of the semiconductor substrate, the BJT including a collector located in the semiconductor substrate and laterally surrounded by at least one shallow trench isolation structure, an epitaxial base located on the collector, a first polycrystalline extrinsic base portion contacting an entirety of sidewalls of the epitaxial base, a second polycrystalline extrinsic base portion contacting an entirety of outer sidewalls of the first polycrystalline extrinsic base portion, and an emitter contacting the epitaxial base and the first polycrystalline extrinsic base portion but not contacting the second polycrystalline extrinsic base portion.

DETAILED DESCRIPTION

Figure 1:
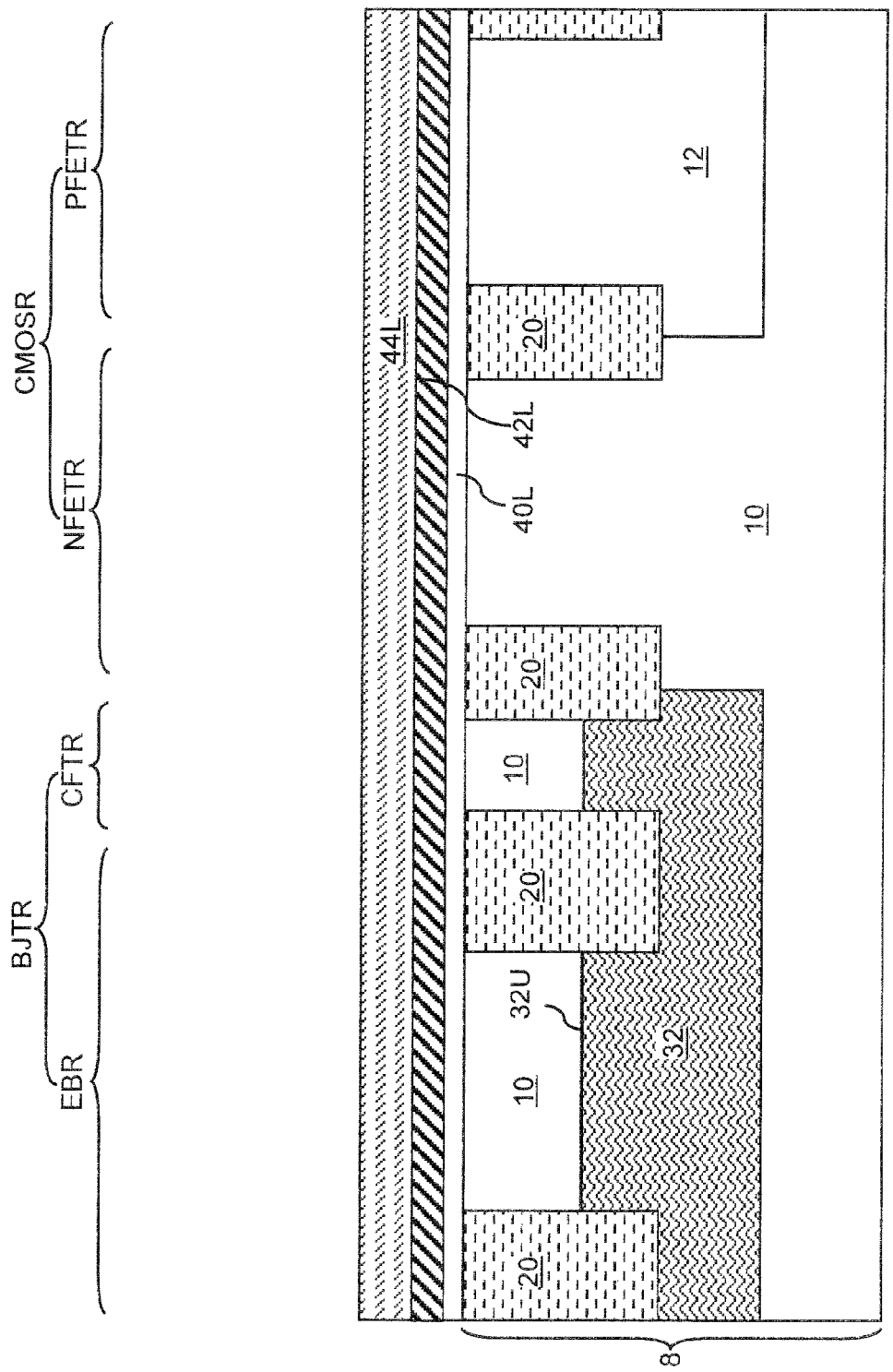
FIG. 1 is a vertical cross-sectional view of an exemplary structure according to an embodiment of the present invention after formation of a high dielectric constant (high-k) dielectric material layer, a metal layer, and a first semiconductor material layer.

The present invention, which provides BiCMOS integrated structures including a bipolar transistor including a self-aligned base formed by selective epitaxy and CMOS devices having a metal gate and a high-k gate dielectric and methods of manufacturing the same, will now be described in more detail by referring to the accompanying drawings. Like and corresponding elements are referred to by like reference numerals in the drawings.

Referring to the vertical cross-sectional view of FIG. 1, an exemplary semiconductor structure according to an embodiment of the present invention includes a semiconductor substrate 8, a high dielectric constant (high-k) dielectric material layer 40L, a metal layer 42L, and an optional first semiconductor material layer 44L. The exemplary semiconductor structure may be formed by providing a semiconductor substrate including a single crystalline semiconductor layer 10. At least one shallow trench isolation structure 20 and a subcollector region 32 are formed in the semiconductor substrate 8.

The single crystalline semiconductor layer 10 includes a single crystalline, i.e., epitaxial, semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the single crystalline semiconductor layer 10 is a single crystalline silicon material. The doping of the single crystalline semiconductor layer 10 as provided in the semiconductor substrate 8 may be optimized for device performance.

The subcollector region 32 is formed by implanting dopant of a first conductivity type into the single crystalline semiconductor layer 10 by ion implantation employing an implantation mask. The first conductivity type may be p-type of n-type. While the present invention is described for the case in which the first conductivity type is n-type, embodiments in which the first conductivity type is p-type may also be employed. The depth of the upper surface 32U of the subcollector region 32 may be from 100 nm to 500 nm, and preferably from 150 nm to 400 nm. The upper surface 32U of the subcollector region 32 is the interface between the subcollector region 32 and portions of the single crystalline semiconductor layer 10 located above the single crystalline semiconductor layer 10. The thickness of the subcollector region may be from 100 nm to 600 nm, although lesser and greater thicknesses may also be employed.

The single crystalline semiconductor layer 10 may be doped with dopants of a second conductivity type, which is the opposite of the first conductivity type. For example, the second conductivity type is a p-type if the first conductivity type is n-type, and vice versa. A first conductivity type doped well 12 may be formed by converting a portion of the single crystalline semiconductor layer 10 into a region having a doping of the first conductivity type by ion implantation.

For the purposes of description of the present invention, the regions of the exemplary semiconductor structure are divided into an emitter-base region EBR, a collector feedthrough region CFTR, an n-type field effect transistor (NFET) region NFETR, and a p-type field effect transistor (PFET) region. The exemplary semiconductor structure may include a plurality of any of emitter-base regions, collector feedthrough regions, n-type field effect transistor regions, and p-type field effect transistor regions, and may also include regions for any other type of semiconductor devices. The emitter-base region EBR and the collector feedthrough region CFTR are collectively referred to as a bipolar junction transistor (BJT) region BJTR, and the NFET region NFETR and the PFET region PFETR are collectively referred to as a complementary metal-oxide-semiconductor (CMOS) region CMOSR.

The at least one shallow trench isolation structure 20 is formed by an etch that forms trenches in the single crystalline semiconductor layer 10. The trenches extend from the top surface of the single crystalline semiconductor layer 10 to a depth, which is preferably greater than the depth of the upper surface 32U of the subcollector region 32. The depth of the trenches may be from 150 nm to 700 nm, and preferably from 200 nm to 600 nm, although lesser and greater depths may also be employed. The trenches are filled with a dielectric material such as silicon oxide, silicon nitride, silicon oxynitride, or a combination thereof, which is subsequently planarized to form the at least one shallow trench isolation structure 20.

Various semiconductor regions laterally surrounded by the at least one shallow trench isolation structure are provided in the exemplary semiconductor structure. For example, a first semiconductor region comprising the single crystalline semiconductor material and laterally surrounded by the at least one shallow trench isolation region 20 and located above the subcollector region 20 is provided in the emitter-base region EBR. A second semiconductor region comprising the single crystalline semiconductor material and laterally surrounded by the at least one shallow trench isolation region 20 and located above the subcollector region 20 is provided in the collector feedthrough region CFTR. The first semiconductor region and the second semiconductor region are portions of the single crystalline semiconductor layer 10. A third semiconductor region having a doping of the second conductivity type, laterally surrounded by the at least one shallow trench isolation structure 20, and constituting a portion of the single crystalline semiconductor layer 10 is provided in the NFET region NFETR. A fourth semiconductor region having a doping of the first conductivity type, laterally surrounded by the at least one shallow trench isolation structure 20, and constituting a portion of the first conductivity type doped well 12 is provided in the PFET region PFETR.

A high dielectric constant (high-k) dielectric material layer 40L is formed on a top surface of the semiconductor substrate 8. The high-k dielectric material layer 40L comprises a high dielectric constant (high-k) material comprising a dielectric metal oxide and having a dielectric constant that is greater than the dielectric constant of silicon oxide of 3.9. Preferably, the dielectric metal oxide has a dielectric constant that is greater than the dielectric constant of silicon nitride of 7.5. The high-k dielectric material layer 40L may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc.

The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric material layer 40L may be from 1 nm to 10 nm, and preferably from 1.5 nm to 3 nm. The high-k dielectric material layer 40L may have an effective oxide thickness (EOT) on the order of, or less than, 1 nm.

A metal layer 42L is deposited directly on the top surface of the high-k dielectric material layer 40L. The metal layer 42L may be formed, for example, by chemical vapor deposition (CVD), physical vapor deposition (PVD), or atomic layer deposition (ALD). The metal layer 42L has a material that is an elemental metal, a metallic alloy, a conductive metallic nitride, or a conductive metallic carbide.

In one embodiment, the material of the metal layer 42L may be a conductive transition metal nitride or a conductive transition metal carbide. The first metallic compound is a compound of a first metallic element selected from transition metals and a non-metallic element. If the non-metallic element is nitrogen, the first metallic compound is a transition metal nitride. If the non-metallic element is carbon, the first metallic compound is a transition metal carbide. For example, the first metallic compound may be selected from TiN, TiC, TaN, TaC, and a combination thereof. As used herein, transition metals include elements from Group 3B, 4B, 5B, 6B, 7B, 8B, 1B, and 2B and Lanthanides and Actinides in the Periodic Table of the Elements. The thickness of the metal layer 42L may be from 1 nm to 10 nm, and preferably from 3 nm to 10 nm, although lesser and greater thicknesses are also contemplated herein.

In another embodiment, the material of the metal layer 42L may include a metal in elemental form. Typical elemental metals that may be selected for the metal layer 42L include, but are not limited to, Al, Be, Mg, Ca, Sr, Ba, Sc, Y, La, Ti, Zr, Hf, Dy, Lu, Er, Pr, and Ce. The elemental metal may consist of at least one alkaline earth metal. Alternately, the metal layer 42L consists of at least one transition metal. Yet alternately, the metal layer 42L may consist of a mixture of at least one alkaline earth metal and at least one transition metal. Preferably, the thickness of the metal layer 42L is from 0.1 nm to 3.0 nm, although lesser and greater thicknesses are also contemplated herein.

An optional first semiconductor material layer 44L is deposited directly on the top surface of the metal layer 42L, for example, by low pressure chemical vapor deposition (LPCVD), rapid thermal chemical vapor deposition (RTCVD), or plasma enhanced chemical vapor deposition (PECVD). The formation of the optional first semiconductor material layer 44L is may, or may not, be present in the exemplary semiconductor structure of the present invention. The optional first semiconductor material layer 44L comprises a polycrystalline or amorphous semiconductor material. For example, the optional first semiconductor material layer 44L may comprise polysilicon, a polycrystalline silicon germanium alloy, a polycrystalline silicon carbon alloy, or a polycrystalline silicon germanium carbon alloy.

In one embodiment, the optional first semiconductor material layer 44L may be formed as a doped polycrystalline semiconductor layer through in-situ doping. Alternately, the optional first semiconductor material layer 44L may be deposited as an intrinsic semiconductor material, and is subsequently doped by ion implantation of dopant atoms prior to patterning of gate electrodes. The thickness of the optional first semiconductor material layer 44L may be from 5 nm to 200 nm, and typically from 20 nm to 50 nm, although lesser and greater thicknesses may also be employed.

Figure 2:
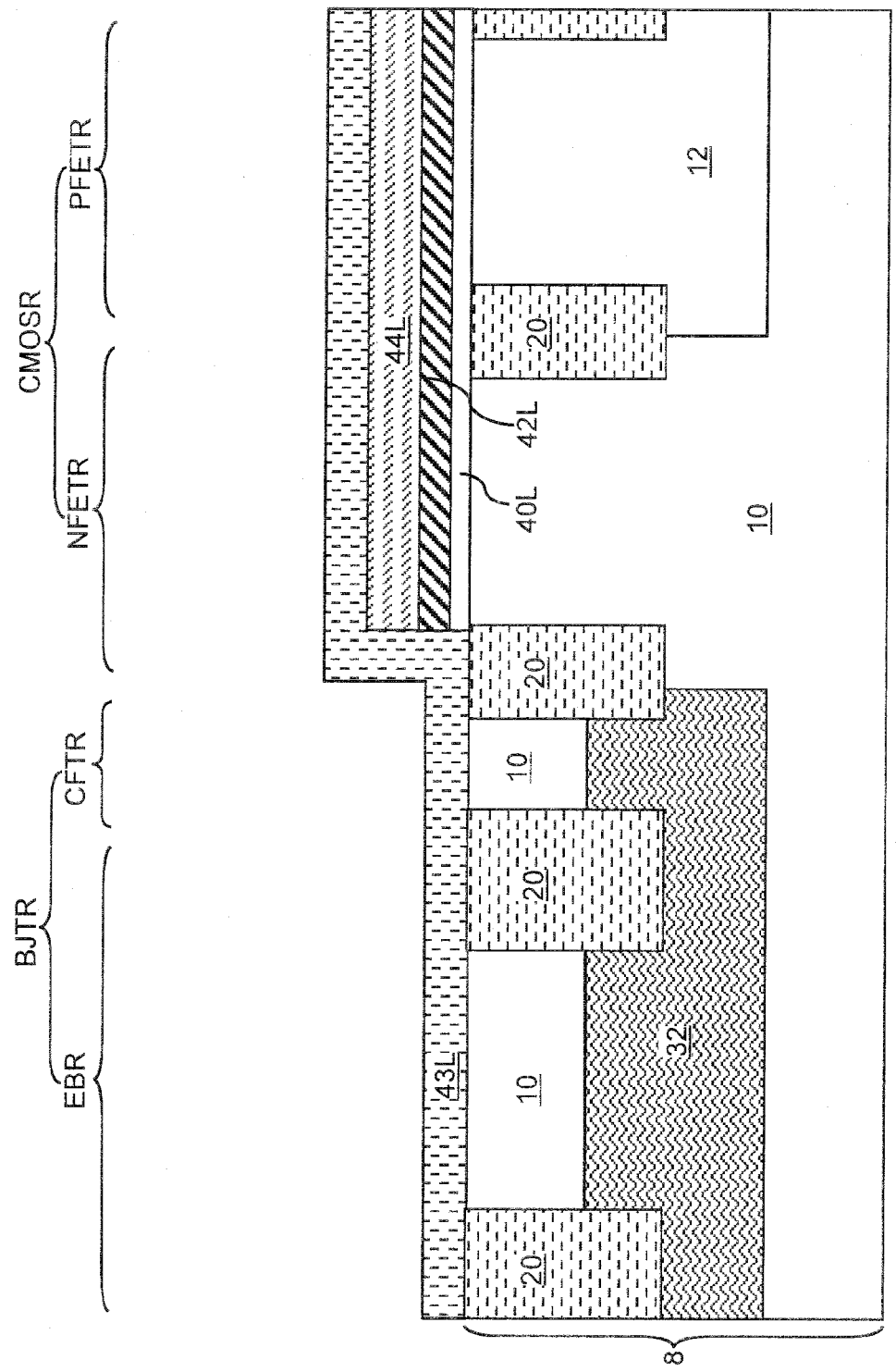
FIG. 2 is a vertical cross-sectional view of the exemplary structure after deposition of a disposable material layer.

Referring to FIG. 2, the vertical stack of the optional first semiconductor material layer 44L, the metal layer 42, and the high-k dielectric material layer 40L is lithographically patterned to expose the top surfaces of the single crystalline semiconductor layer 10 in the BJT region BJTR. However, the vertical stack of the optional first semiconductor material layer 44L, the metal layer 42, and the high-k dielectric material layer 40L covers the top surfaces of the single crystalline semiconductor layer 10 in the CMOS region CMOSR.

A disposable material layer 43L is deposited directly on the top surfaces of the first semiconductor region and the second semiconductor region within the BJT region BJTR. The disposable material layer 43L comprises a disposable material that may be removed selective to the semiconductor material of the first semiconductor region, which is the material of the single crystalline semiconductor layer 10. Preferably, the disposable material layer 43L comprises a disposable material that may be removed selective to the dielectric material of the at least one shallow trench isolation structure 20 and dielectric material of a dielectric cap material layer and the dielectric material of a stress-generating dielectric material layer that are subsequently formed. Typically, the dielectric cap material layer and the stress-generating dielectric material layer comprise silicon nitride.

In one embodiment, the disposable material layer 43L is a doped silicate glass such as borosilicate glass, which has a higher etch rate that the etch rate of undoped silicate glass that is typically employed for the at least one shallow trench isolation structure 20. Depending on the doping of the doped silicate glass, the doped silicate glass may have an etch rate that is 3-10 times the etch rate of an undoped silicate glass employed in the at least one shallow trench isolation structure 20. An exemplary etch chemistry for etching the doped silicate glass is a hydrofluoric-acid-based etch chemistry.

In another embodiment, the disposable material layer 43L is germanium or a silicon-germanium alloy having a germanium concentration greater than 25%, and preferably greater than 70%. In this case, the semiconductor material of the first semiconductor region is typically a single crystalline silicon. Germanium or a silicon-germanium alloy may be removed selective to silicon. Typically, the etch selectivity of a silicon-germanium alloy relative to silicon increases with the concentration of germanium in the silicon-germanium alloy.

Figure 3:
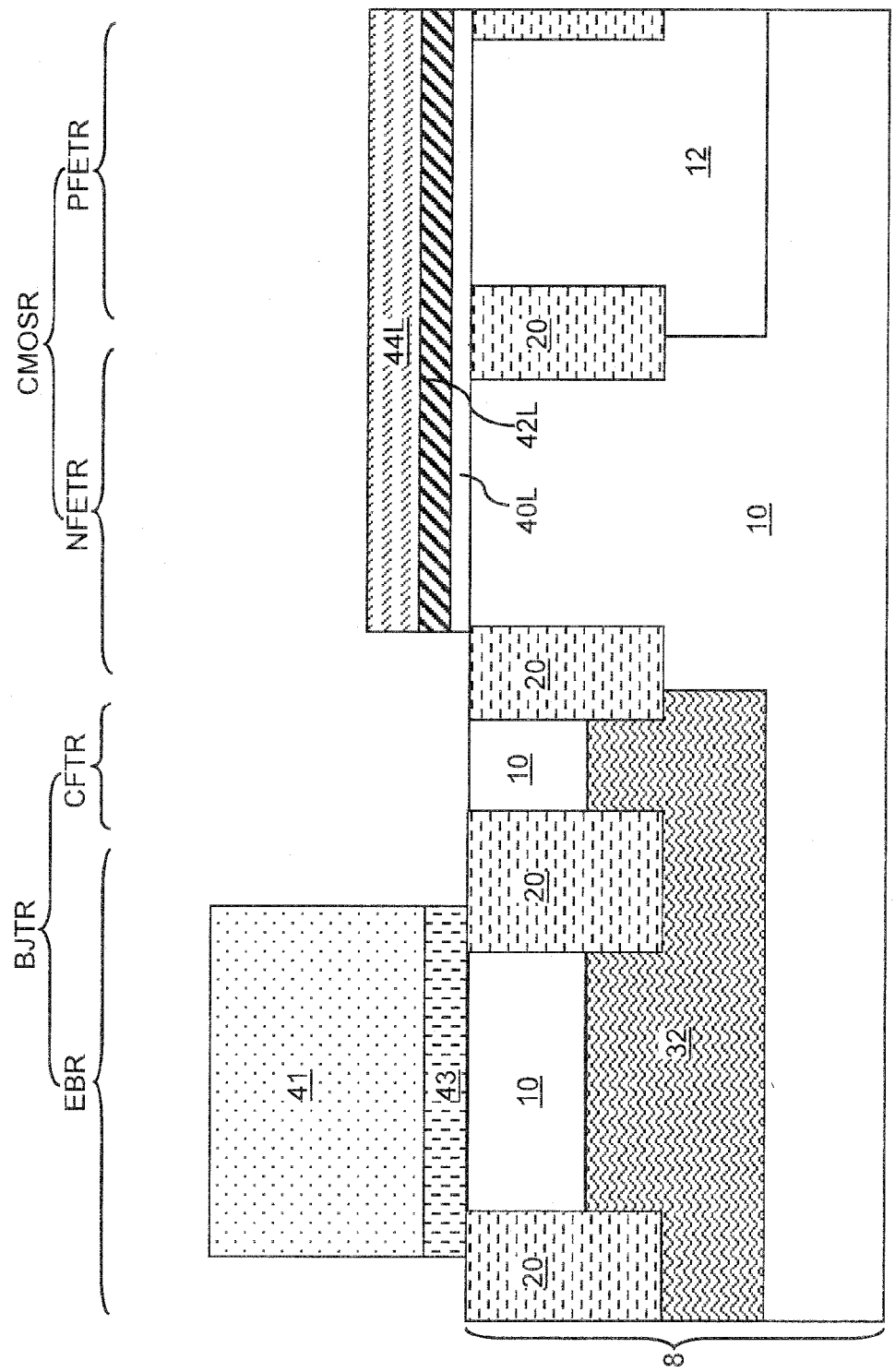
FIG. 3 is a vertical cross-sectional view of the exemplary structure after patterning of the disposable material layer to form a disposable material portion.

Referring to FIG. 3, the disposable material layer 43L is lithographically patterned by employing a first photoresist 41 and an etch to form a disposable material portion 43 directly on the top surface of the first semiconductor region in the emitter-base region EBR. The disposable material layer 43L is removed in the collector feedthrough region CFTR and the CMOS region CMOSR. The entirety of the periphery of the disposable material portion 43 overlies at least one shallow trench isolation structure 20 that laterally surrounds the first semiconductor region, i.e., the portion of the single crystalline semiconductor layer 10 located above the subcollector region 32 and in the emitter-base region EBR. The thickness of the disposable material layer 43L may be from 5 nm to 200 nm, and preferably from 20 nm to 50 nm, although lesser and greater thicknesses may also be employed. The first photoresist 41 is subsequently removed, for example, by ashing.

Figure 4:
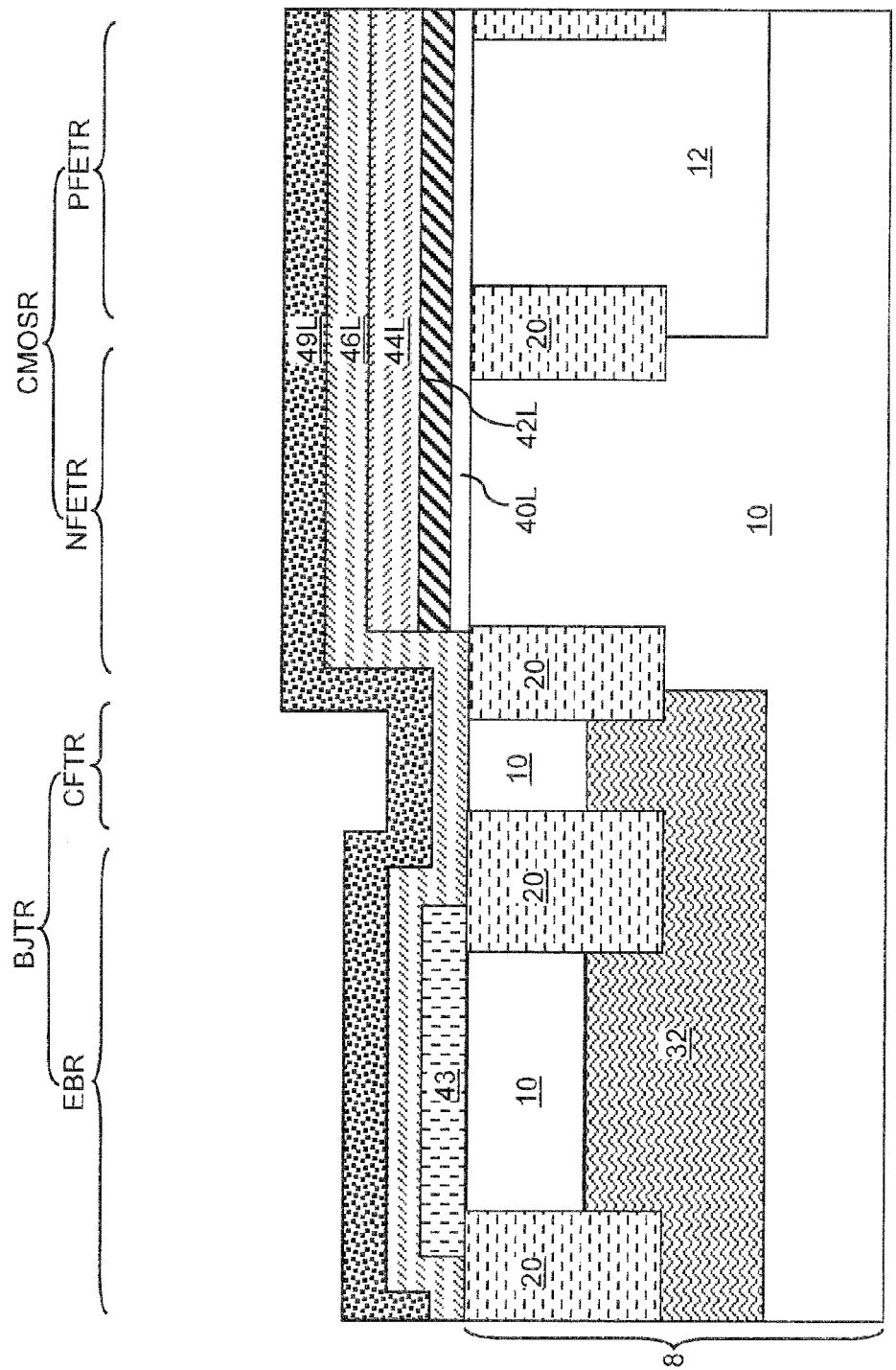
FIG. 4 is a vertical cross-sectional view of the exemplary structure after deposition of a second semiconductor material layer and a dielectric cap material layer.

Referring to FIG. 4, a second semiconductor material layer 46L and a dielectric cap material layer 49L are deposited directly on the disposable material portion 43 and the exposed surfaces of the optional first semiconductor material layer 44L and/or the metal layer 42L. The second semiconductor material layer 46L may comprise any semiconductor material provided that the material of the disposable material portion 43 may be removed selective to the material of the second semiconductor material layer 46L. For example, the second semiconductor material layer 46L may comprise polysilicon, a polycrystalline silicon germanium alloy, a polycrystalline silicon carbon alloy, or a polycrystalline silicon germanium carbon alloy. If the disposable material portion 43 comprises germanium, the second semiconductor material layer 46L preferably comprises polysilicon.

The second semiconductor material layer 46L has a doping of the first conductivity type, i.e., the conductivity type that is the opposite of the conductivity type of the subcollector region 32. The second semiconductor material layer 46L may be formed, for example, by low pressure chemical vapor deposition (LPCVD), rapid thermal chemical vapor deposition (RTCVD), or plasma enhanced chemical vapor deposition (PECVD). The thickness of the second semiconductor material layer 46L may be from 20 nm to 200 nm, and preferably from 40 nm to 100 nm, although lesser and greater thicknesses may also be employed.

The dielectric cap material layer 49L comprises a dielectric material. Preferably, the dielectric cap material layer 49L comprises silicon nitride. The dielectric cap material layer may be formed, for example, by low pressure chemical vapor deposition (LPCVD), rapid thermal chemical vapor deposition (RTCVD), or plasma enhanced chemical vapor deposition (PECVD). The thickness of the dielectric cap layer 49L may be from 10 nm to 150 nm, and preferably from 20 nm to 100 nm, although lesser and greater thicknesses may also be employed.

Figure 5:
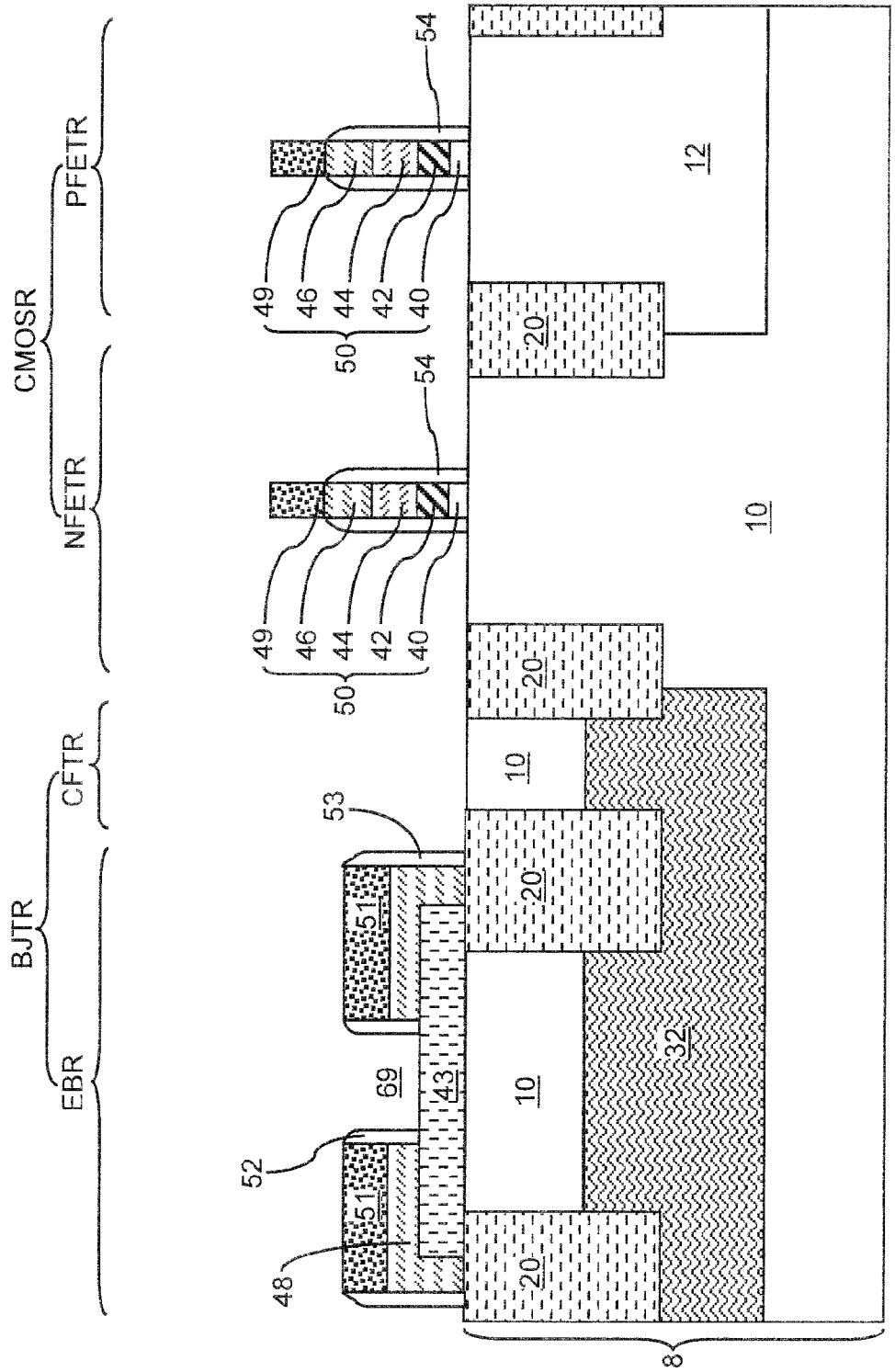
FIG. 5 is a vertical cross-sectional view of the exemplary structure after patterning of gate stacks and a mesa structure and formation of first gate spacers, a first inner spacer, and a first outer spacer.

Referring to FIG. 5, the vertical stack of the dielectric cap material layer 49L, the second semiconductor material layer 46L, the optional first semiconductor material layer 44L, the metal layer 42L, and the high-k dielectric material layer 40L is lithographically patterned to form a mesa structure in the emitter-base region EBR and gate stacks 50 in the NFET region NFETR and in the PFET region PFETR. Preferably, the etch process employed to pattern the high-k dielectric material layer 40L is selective to the semiconductor material of the single crystalline semiconductor layer 10. Preferably, the etch processes employed to pattern the optional first semiconductor material layer 44L, the metal layer 42L, and the high-k dielectric material layer 40L are selective to the material of the disposable material portion 43.

Each gate stack 50 includes a dielectric gate cap 49, a second semiconductor material portion 46, an optional first semiconductor material portion 44, a metal portion 42, and a high dielectric constant (high-k) gate dielectric 40. The sidewalls of the various material portions (49, 46, 44, 42, 40) in each gate stack 50 are vertically coincident, i.e., located in a same vertical plane.

The mesa structure includes a vertical stack of a remaining portion of the second semiconductor material layer 46L in the emitter-base region EBR, which is herein referred to as a second polycrystalline extrinsic base portion 48, and a remaining portion of the dielectric cap material layer 49L in the emitter-base region EBR, which is herein referred to as a dielectric cap material mesa portion 51. The mesa structure (48, 51) is ring-shaped and laterally surrounds a cavity 69, which is located above a center portion of the disposable material portion 43. The cavity overlies a center portion of the first semiconductor region. The top surface of the disposable material portion 43 is exposed within the cavity 69.

The second semiconductor material portions 46 have the same thickness and the same composition as the second polycrystalline extrinsic base portion 48. The dielectric gate caps 49 have the same thickness and the same composition as the dielectric cap material mesa portion 51. The entirety of the outer periphery of the mesa structure (48, 51) overlies the at least one shallow trench isolation structure 20. The entirety of the inner periphery of the mesa structure (48, 51) overlies the first semiconductor region, which is the portion of the single crystalline semiconductor layer 10 that is located above the subcollector region 32 and in the emitter-base region EBR.

Various source and drain extension regions (not shown) may be formed by employing at least one masked ion implantation. Various halo implantations may be performed as needed employing at least another masked ion implantation.

A dielectric material layer is deposited and anisotropically etched to form first gate spacers 54, a first inner spacer 52, and a first outer spacer 53. Each of the first gate spacers 54 contacts and laterally surrounds a gate stack (40, 43, 44, 46, 49). The first inner spacer 52 is a first inner mesa spacer formed directly on the inner sidewalls of the mesa structure (48, 51). The first outer spacer 53 is a first outer mesa spacer formed directly on the outer sidewalls of the mesa structure (48, 51), and laterally abuts and surrounds the mesa structure (48, 51). The first gate spacers 54, the first inner spacer 52, and the first outer spacer 53 comprise a first dielectric material and have a first lateral width. In other words, the first gate spacers 54, the first inner spacer 52, and the first outer spacer 53 have a same composition and a same lateral thickness as measured at the bottom of each spacer. The first dielectric material may be silicon oxide, and the first lateral width may be from 10 nm to 100 nm, although lesser and greater lateral widths may also be employed.

Figure 6:
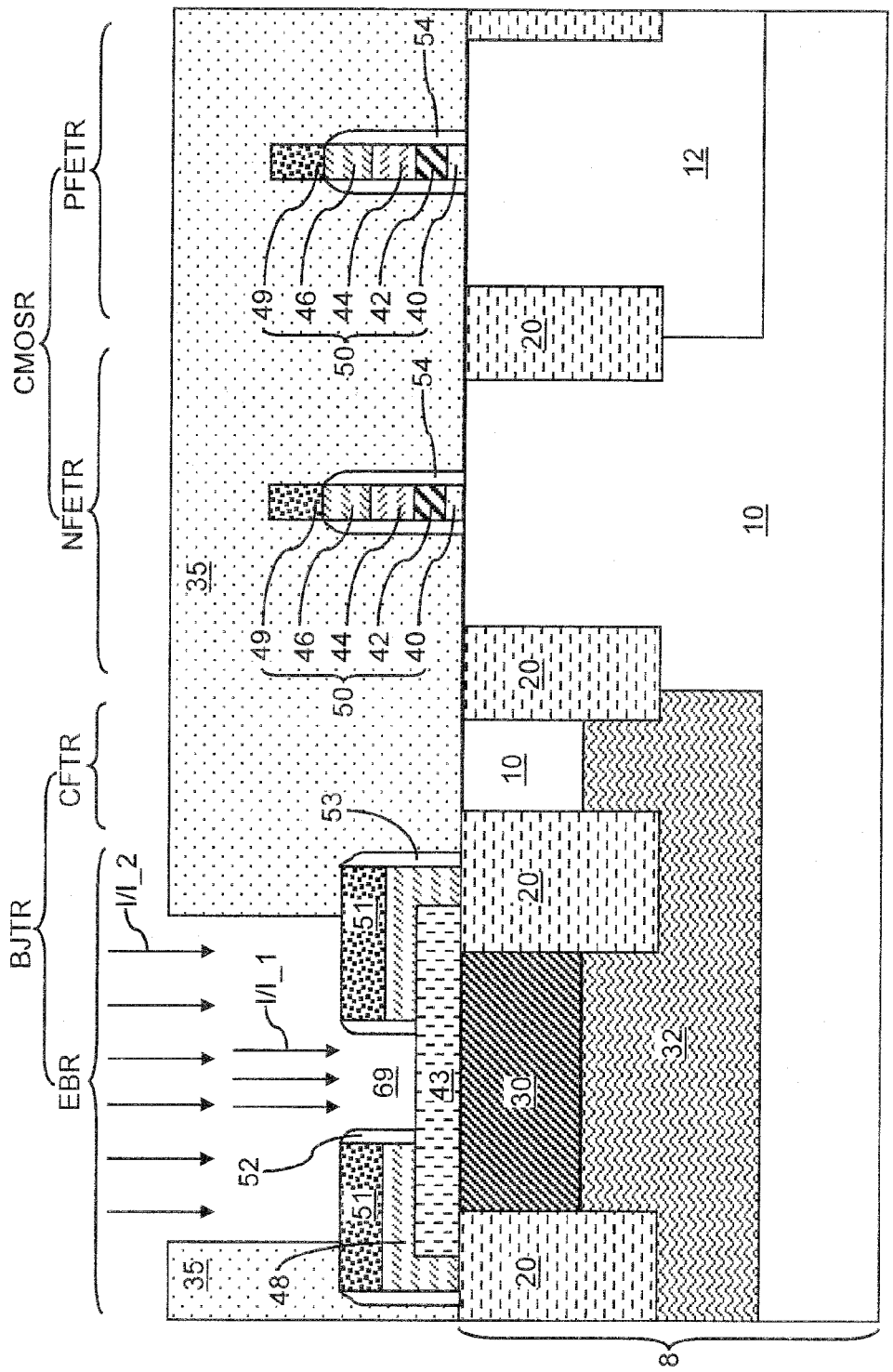
FIG. 6 is a vertical cross-sectional view of the exemplary structure during ion implantation of ions through the mesa structure or the cavity in the mesa structure to form a collector.

Referring to FIG. 6, a second photoresist 35 is applied to the top surfaces of the exemplary semiconductor structure and lithographically patterned to form an opening over the disposable material portion 43 in the emitter-base region EBR. First ions of the first conductivity type, which is the conductivity of the dopants of the subcollector region 32, may be implanted through the cavity in the mesa structure (48, 51) into a center portion of the first semiconductor region in the emitter-base region EBR. In this case, the mesa structure (48, 51) including the cavity 69 is employed as a self-aligning mask for the first ions. In other words, the mesa structure (48, 51) self-aligns the first ions by letting only the first ions that pass through the cavity 69. The path of the first ions is schematically shown as I/I_1. In addition, second ions of the first conductivity type may be implanted through the opening in the second photoresist 35 into the first semiconductor region in the emitter-base region EBR. In this case, the second photoresist 35 is employed as the masking layer for the second ions. The path of the second ions is schematically shown as I/I_2. In case the first conductivity type is n-type, first and second ions may be selected from ions of P, As, and Sb. In case the second conductivity type is p-type, first and second ions may be selected from B, Ga, and In.

The first semiconductor region after the implantation of the first and/or second ions is doped with dopants of the first conductivity type, and constitutes a collector 30 of a bipolar junction transistor. The collector 30 vertically abuts the subcollector region 32. are implanted into ion implantation of ions through the mesa structure or the cavity in the mesa structure to form a collector.

The doping concentration of the collector 30 is in the range from $1.0 \times 10^{18}/cm^3$ to $1.0 \times 10^{21}/cm^3$, and preferably from $1.0 \times 10^{19}/cm^3$ to $1.0 \times 10^{20}/cm^3$. The doping profile and the thickness of the collector 30 are optimized for transistor performance. The subcollector region 32 is heavily doped with the same type dopants as the collector 30, typically at a concentration on the order of $1.0 \times 10^{21}/cm^3$. The second photoresist 35 is subsequently removed.

Figure 7:
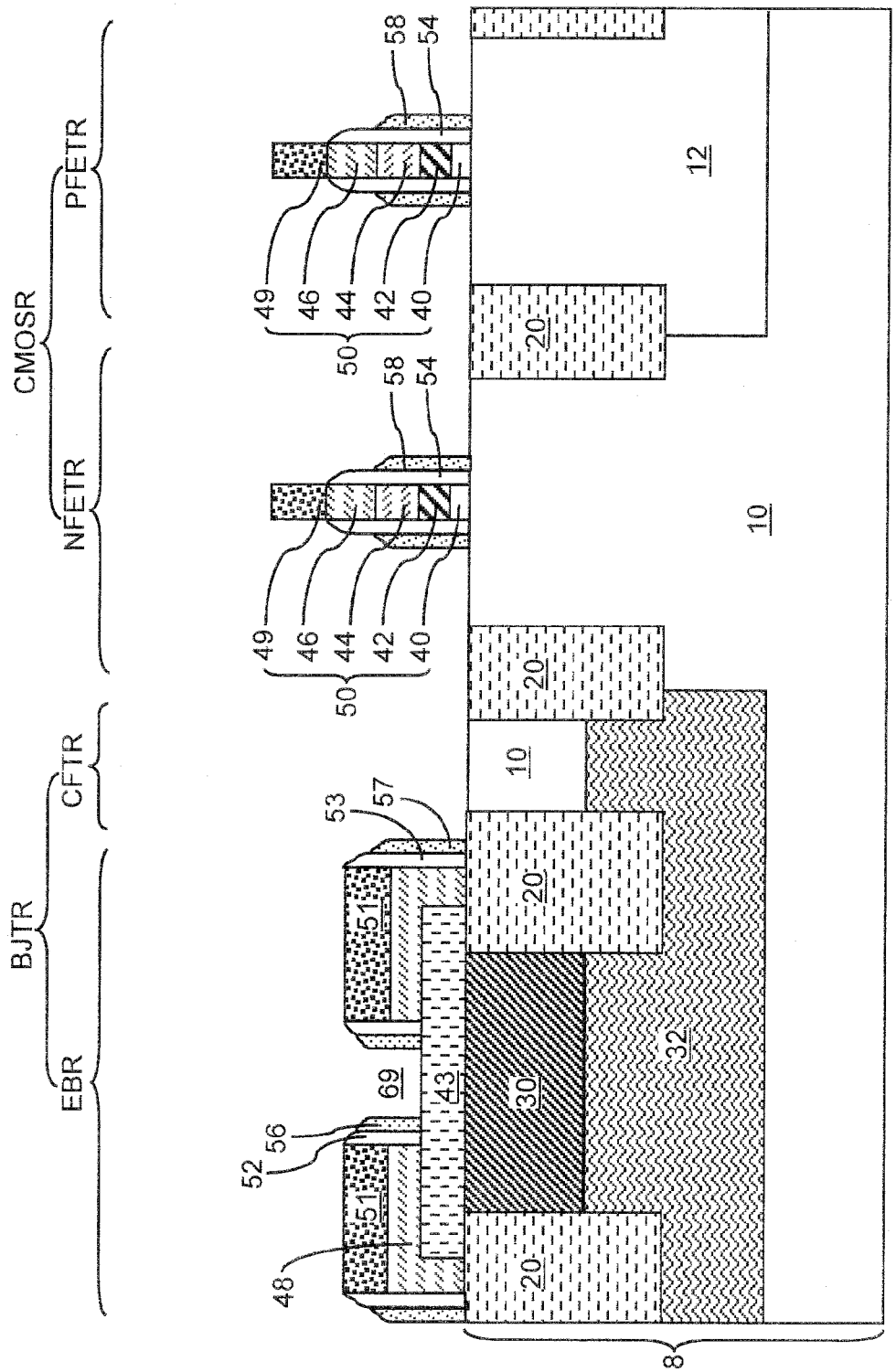
FIG. 7 is a vertical cross-sectional view of the exemplary structure after formation of second gate spacers, a second inner spacer, and a second outer spacer.

Referring to FIG. 7, another dielectric material layer is deposited and anisotropically etched to form second gate spacers 58, a second inner spacer 56, and a second outer spacer 57. Each of the second gate spacers 58 contacts and laterally surrounds a first gate spacer 54. The second inner spacer 56 is a second inner mesa spacer formed directly on sidewalls of the first inner spacer 52 within the cavity 69. The second outer spacer 57 is a second outer mesa spacer formed directly on the outer sidewalls of the first outer spacer 53, and laterally abuts and surrounds the first outer spacer 53. The second gate spacers 58, the second inner spacer 56, and the second outer spacer 57 have a same composition and a same lateral thickness as measured at the bottom of each spacer. For example, the second gate spacers 58, the second inner spacer 52, and the second outer spacer 57 may comprise silicon nitride.

Figure 8:
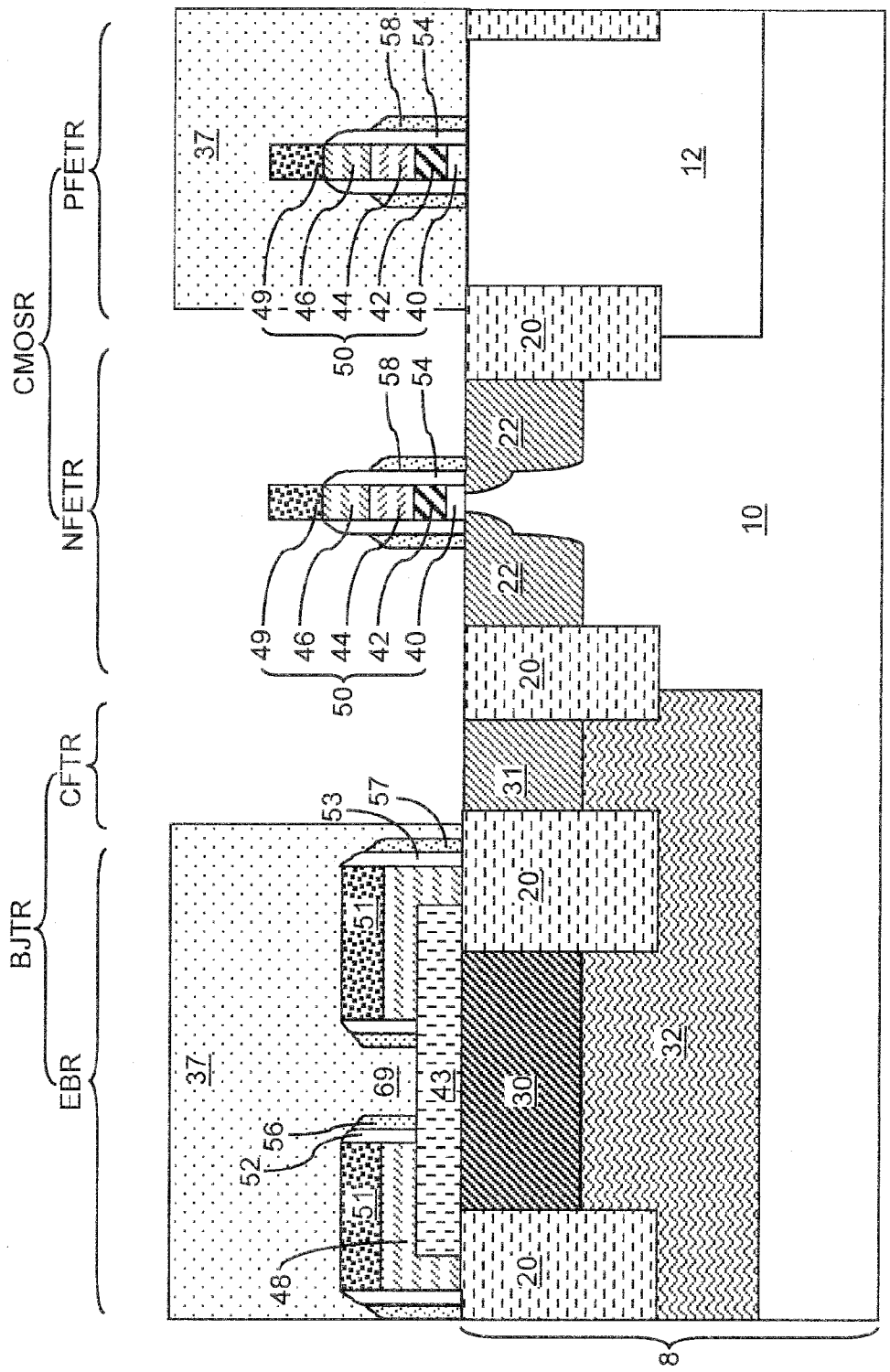
FIG. 8 is a vertical cross-sectional view of the exemplary structure after formation of source and drain regions of a first conductivity type and a subcollector feedthrough.

Referring to FIG. 8, a third photoresist 37 is applied to the top surfaces of the exemplary semiconductor structure and lithographically patterned to cover the emitter-base region EBR and the PFET region PFETR. The third photoresist 37 is removed in the collector feedthrough region CFTR and in the NFET region NFETR by lithographic patterning.

Ions of the first conductivity type are implanted into the semiconductor substrate 8 employing the third photoresist 37 as an implantation mask layer. A subcollector feedthrough 31 is formed in the implanted portion of the single crystalline semiconductor layer 10 in the collector feedthrough region CFTR, and source and drain regions 22 of the first conductivity type are formed in the NFET region NFETR. The subcollector feedthrough 31 contacts the subcollector region 32, and extends from the subcollector region 32 to the top surface of the single crystalline semiconductor layer 10, which is the top surface of the substrate 8.

The bottom portions of the source and drain regions 22 in the NFET region NFETR have a same doping as the subcollector feedthrough 31. Any difference in doping concentration between the subcollector feedthrough 31 and the source and drain regions 22 in the NFET region NFETR is due to the additional dopants previously introduced into the single crystalline semiconductor layer 10 in the NFET region during formation of source and drain extension regions, which are limited in extent to the upper portion of the source and drain regions 22 in the NFET region NFETR. The third photoresist 37 is subsequently removed, for example, by ashing. Embodiments in which the subcollector feedthrough 31 and the source and drain regions 22 of the first conductivity type are formed in separate steps employing two separate photoresists may also be employed.

Figure 9:
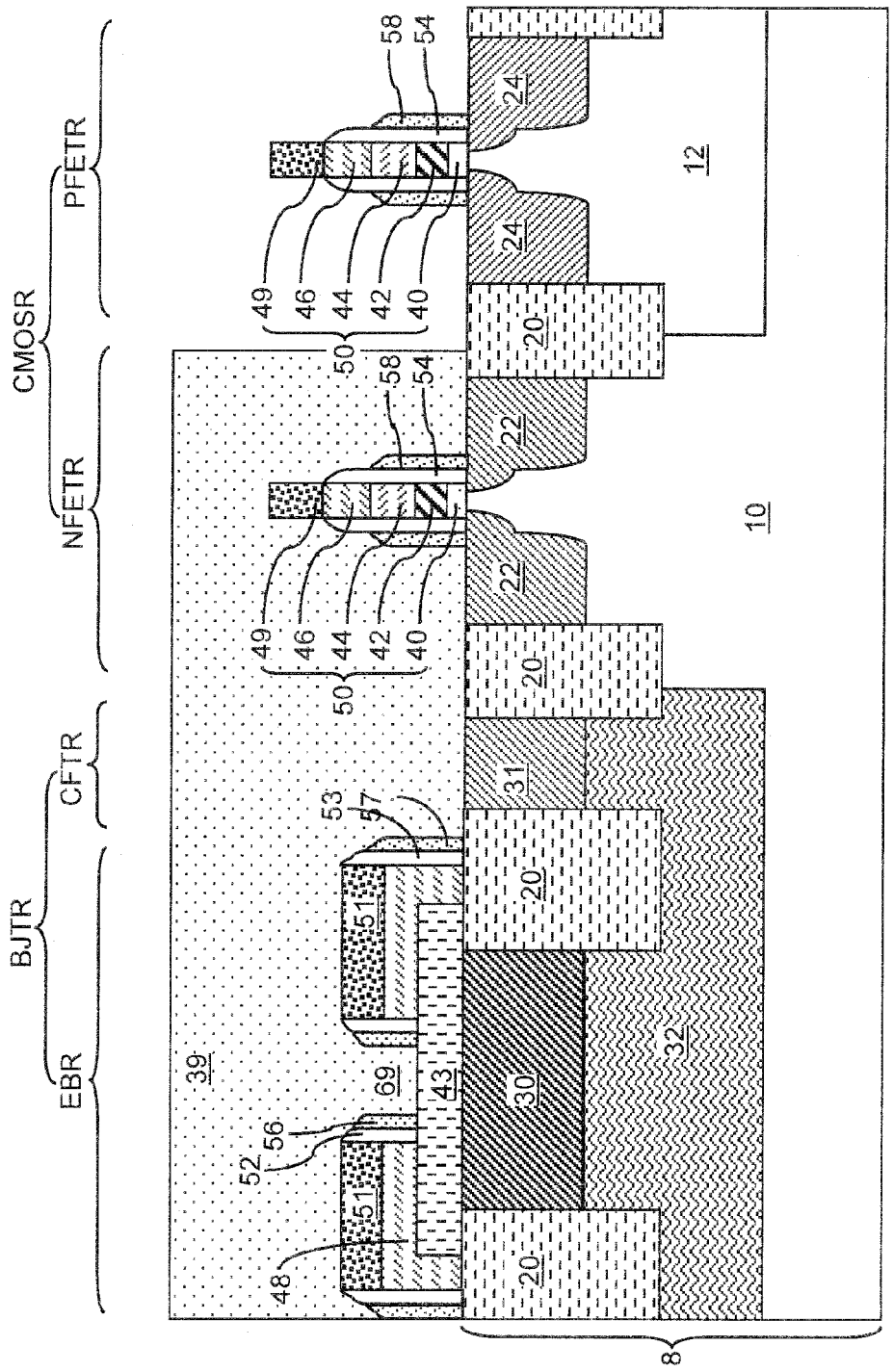
FIG. 9 is a vertical cross-sectional view of the exemplary structure after formation of source and drain regions of a second conductivity type.

Referring to FIG. 9, a fourth photoresist 39 is applied to the top surfaces of the exemplary semiconductor structure and lithographically patterned to cover the emitter-base region EBR, the collector feedthrough region CFTR, and the NFET region NFETR. The fourth photoresist 39 is removed in the PFET region PFETR by lithographic patterning.

Ions of the second conductivity type are implanted into the first conductivity type doped well 12 employing the fourth photoresist 39 as an implantation mask layer. Source and drain regions 24 of the second conductivity type are formed in the PFET region PFETR. The fourth photoresist 39 is subsequently removed, for example, by ashing.

Figure 10:
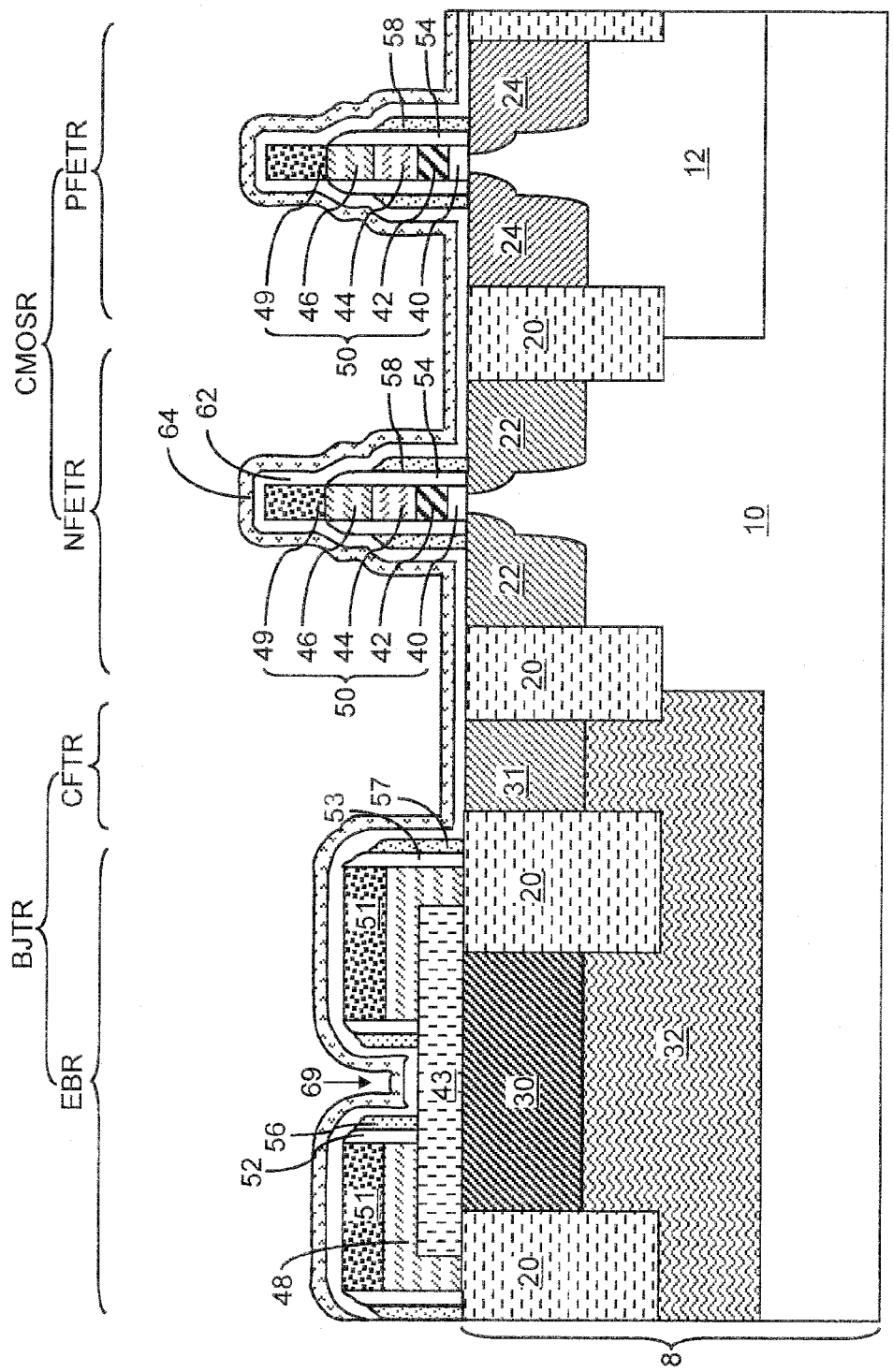
FIG. 10 is a vertical cross-sectional view of the exemplary structure after formation of a buffer dielectric layer and a stress-generating layer.

Referring to FIG. 10, a buffer dielectric layer 62 and a stress-generating layer 64 are deposited on the exposed surfaces of the exemplary semiconductor structure. The buffer dielectric layer 62 is formed directly on the top surfaces of the semiconductor substrate 8, and comprises a material that promotes adhesion of the stress-generating layer 64. For example, the buffer dielectric layer 62 may be a silicon oxide layer. The thickness of the buffer dielectric layer 62 may be from 1 nm to 30 nm, although lesser and greater thicknesses may also be employed.

The stress-generating layer 64 comprises a stress-generating material, which may be a tensile-stress-generating dielectric material or a compressive-stress-generating dielectric material. For example, the stress-generating layer 64 may be a tensile-stress-generating nitride layer or a compressive-stress-generating nitride layer. While this embodiment of the present invention is described for a case in which the stress-generating layer 64 is a tensile-stress-generating dielectric material, which generates a tensile stress in the portion of the single crystalline semiconductor layer 10 located directly underneath, embodiments in which the stress-generating layer 64 is a compressive-stress-generating dielectric material may also be employed. The stress-generating layer 64 may generate a stress on the order of 0.5 GPa to 5.0 GPa in the portions of the single crystalline semiconductor layer 10 located directly underneath depending on the geometry of the gate stacks 50. The thickness of the stress-generating layer 64 may be from 10 nm to 100 nm, although lesser and greater thicknesses may be employed.

Figure 11:
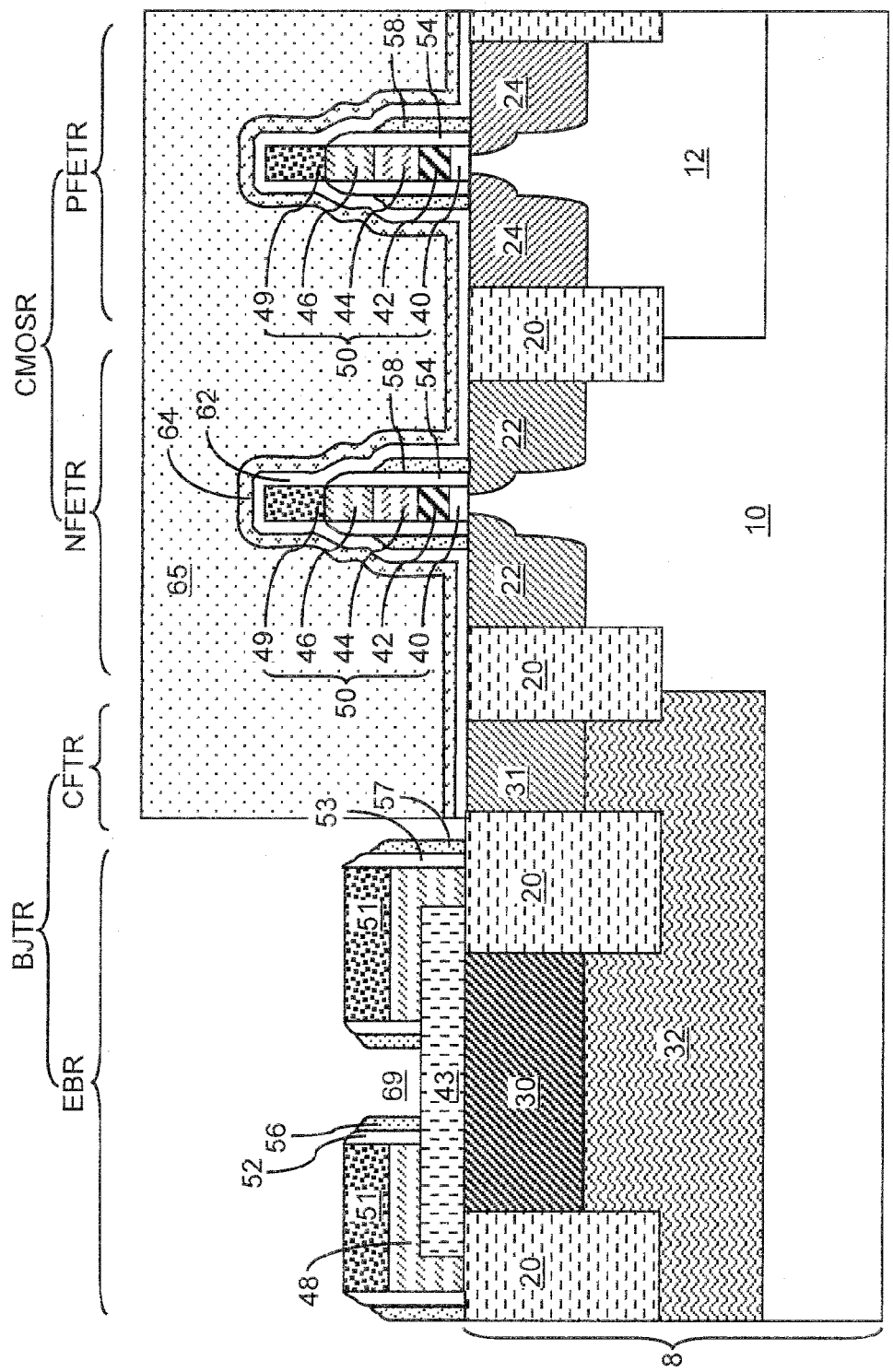
FIG. 11 is a vertical cross-sectional view of the exemplary structure after a first patterning of the buffer dielectric layer and the stress-generating layer.

Referring to FIG. 11, a fifth photoresist 65 is applied to the top surfaces of the exemplary semiconductor structure, and is lithographically patterned to cover the collector feedthrough region CFTR, the NFET region NFETR, and the PFET region PFETR. The fifth photoresist 65 is removed from the emitter-base region EBR. The stress-generating layer 64 and the buffer dielectric layer 62 are removed from the emitter-base region EBR by at least one etch while employing the fifth photoresist 65 as an etch mask.

Figure 12:
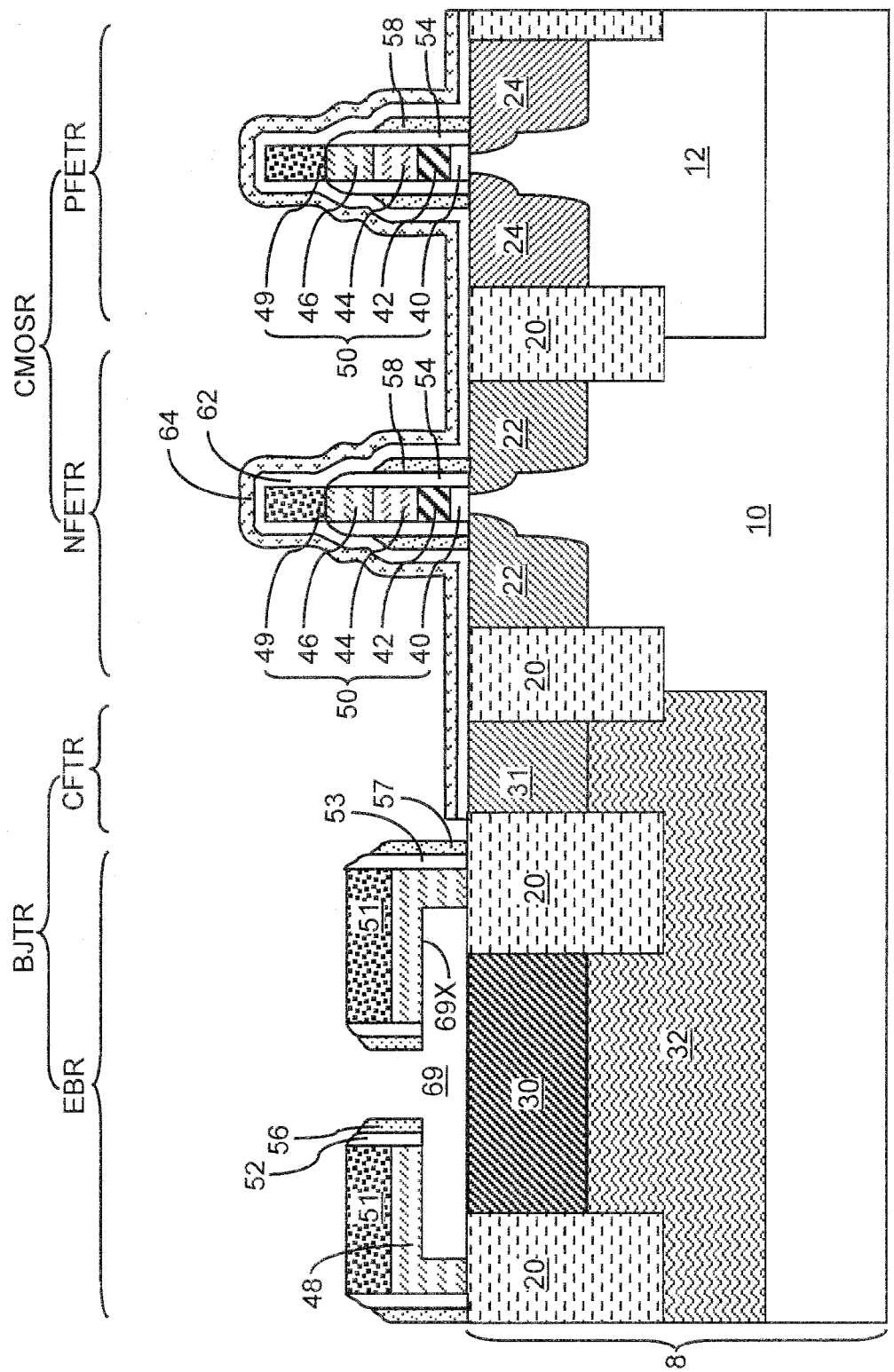
FIG. 12 is a vertical cross-sectional view of the exemplary structure after expanding the cavity in the mesa structure by removing the disposable material portion.

Referring to FIG. 12, the cavity 69 located in, and surrounded by, the mesa structure (48, 51) is expanded by removing the disposable material portion 43 from underneath. Because the mesa structure (48, 51) covers peripheral portions of the disposable material portion 43, the disposable material portion 43 is removed from underneath the mesa structure (48, 51). The top surface of the collector 30, which comprises a single crystalline semiconductor material having a doping of the first conductivity type, is exposed at the bottom of the cavity 69 as expanded. Sidewall surfaces and a bottom surface 69X the second polycrystalline extrinsic base portion 48 are exposed in the expanded cavity 69. The exposed bottom surface 69X of the second polycrystalline extrinsic base portion 48 is a horizontal surface of the second polycrystalline extrinsic base portion 48 that is located above the top surface of the semiconductor substrate 8. The second inner spacer 56 and/or the first inner spacer 52 are undercut with the expansion of the cavity 69. The removal of the disposable material portion 43 may be effected by an etch that is selective to the material of the collector 30 and the materials of the dielectric cap material mesa portion 51 and the stress-generating layer 64.

Figure 13:
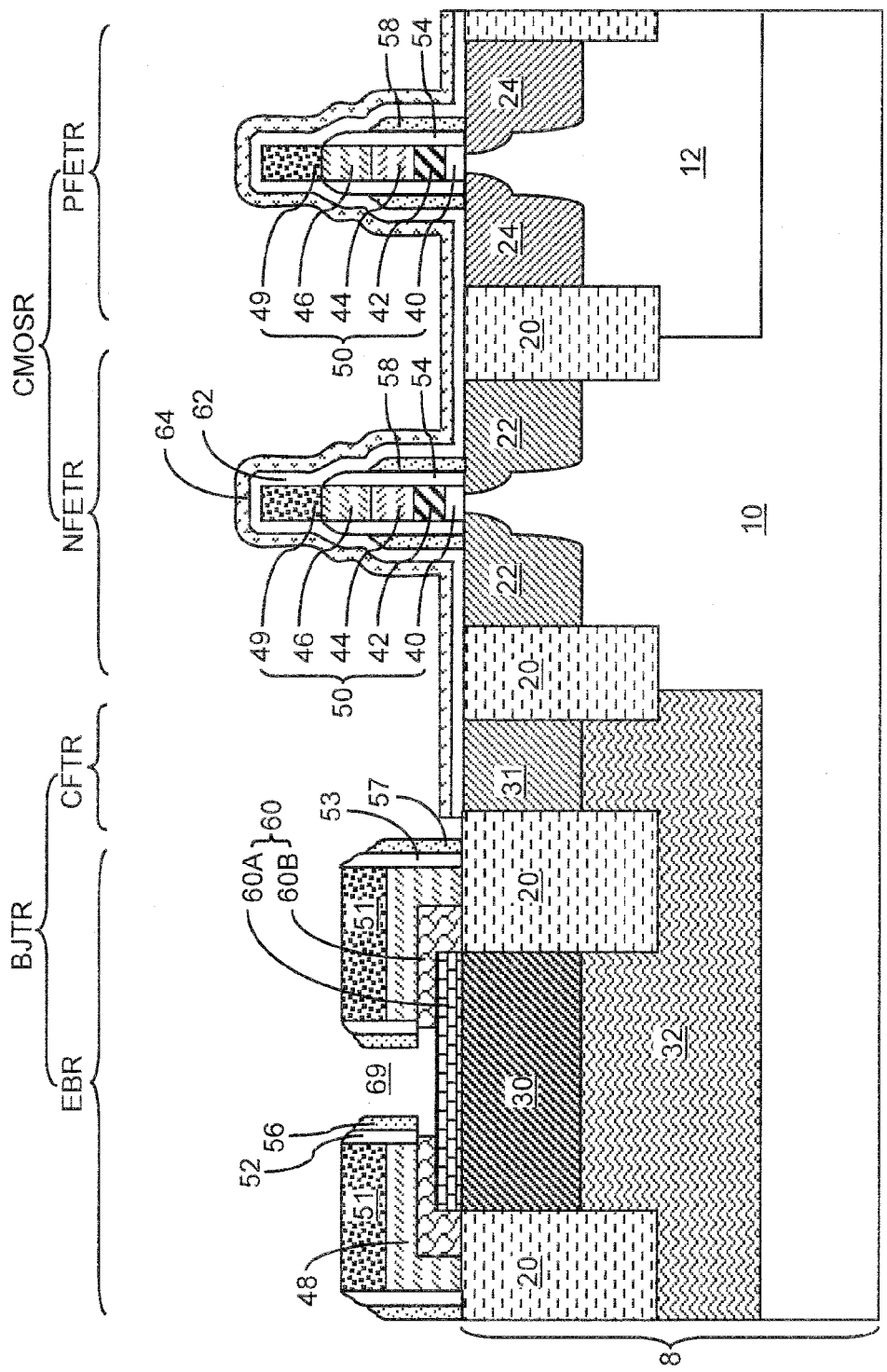
FIG. 13 is a vertical cross-sectional view of the exemplary structure after a selective epitaxy that forms an epitaxial base and a first polycrystalline extrinsic base portion.

Referring to FIG. 13, a selective epitaxy is performed to simultaneously grow an epitaxial base 60A and a first polycrystalline extrinsic base portion 60B in a portion of the cavity 69. The growth of the epitaxial base 60A and the first polycrystalline extrinsic base portion 60B is a selective epitaxy process in which a reactant and an etchant are flowed into a processing chamber concurrently or alternately. The parameters of the selective epitaxy are selected so that no semiconductor material is deposited on dielectric surfaces such as the surfaces of the stress-generating layer 64, the dielectric cap material mesa portion 51, the buffer dielectric layer 62, the at least one shallow trench isolation structure 20, the first inner spacer 52, the second inner spacer 56, the first outer spacer 53, and the second outer spacer 57. Deposition of a semiconductor material on semiconductor surfaces is enabled because nucleation and deposition of the semiconductor material occurs at a greater rate on the semiconductor surfaces such as the exposed surface of the collector 30 and the exposed surfaces of the second polycrystalline extrinsic base portion 48.

The epitaxial base 60A and the first polycrystalline extrinsic base portion 60B have a doping of the second conductivity type, which is the opposite conductivity type of the collector 30. A lower portion of the cavity 69 underneath the bottom surfaces of the second inner spacer 56 and the first inner spacer 52 is partially filled with epitaxially grown base material portions 60, which comprise the epitaxial base 60A and the first polycrystalline extrinsic base portion 60B.

The epitaxial base 60A comprises an epitaxial semiconductor material that is epitaxially aligned to the crystalline lattice structure of the collector 30 because the epitaxial base 60A grows directly on the surface of the collector 30. The first polycrystalline extrinsic base portion 60B comprises a polycrystalline semiconductor material because the first polycrystalline extrinsic base portion 60B grows from the sidewall surfaces and the bottom surface of the second polycrystalline extrinsic base portion 48, which is polycrystalline. The first polycrystalline extrinsic base portion 60B grows concurrently with the growing of the epitaxial base 60A. The first polycrystalline extrinsic base portion 60B contacts the epitaxial base 60A after the selective epitaxy. The first polycrystalline extrinsic base portion 60B and the epitaxial base 60A are formed by the same deposition process, and consequently, comprise the same semiconductor material.

The first polycrystalline extrinsic base portion 60B contacts the entirety of sidewalls of the epitaxial base 60A. The second polycrystalline extrinsic base portion 48 contacts the entirety of outer sidewalls of the first polycrystalline extrinsic base portion 60B.

Because the first polycrystalline extrinsic base portion 60B and the second polycrystalline extrinsic base portion 48 are formed at different processing steps, the first polycrystalline extrinsic base portion 60B and the second polycrystalline extrinsic base portion 48 may comprise different semiconductor materials. In one embodiment, the first polycrystalline extrinsic base portion 60B and the epitaxial base 60A comprise a doped silicon germanium alloy, and the second polycrystalline extrinsic base portion 48 is a semiconductor material that is different from the doped silicon germanium alloy, e.g., polysilicon having a doping of the second conductivity type.

Figure 14:
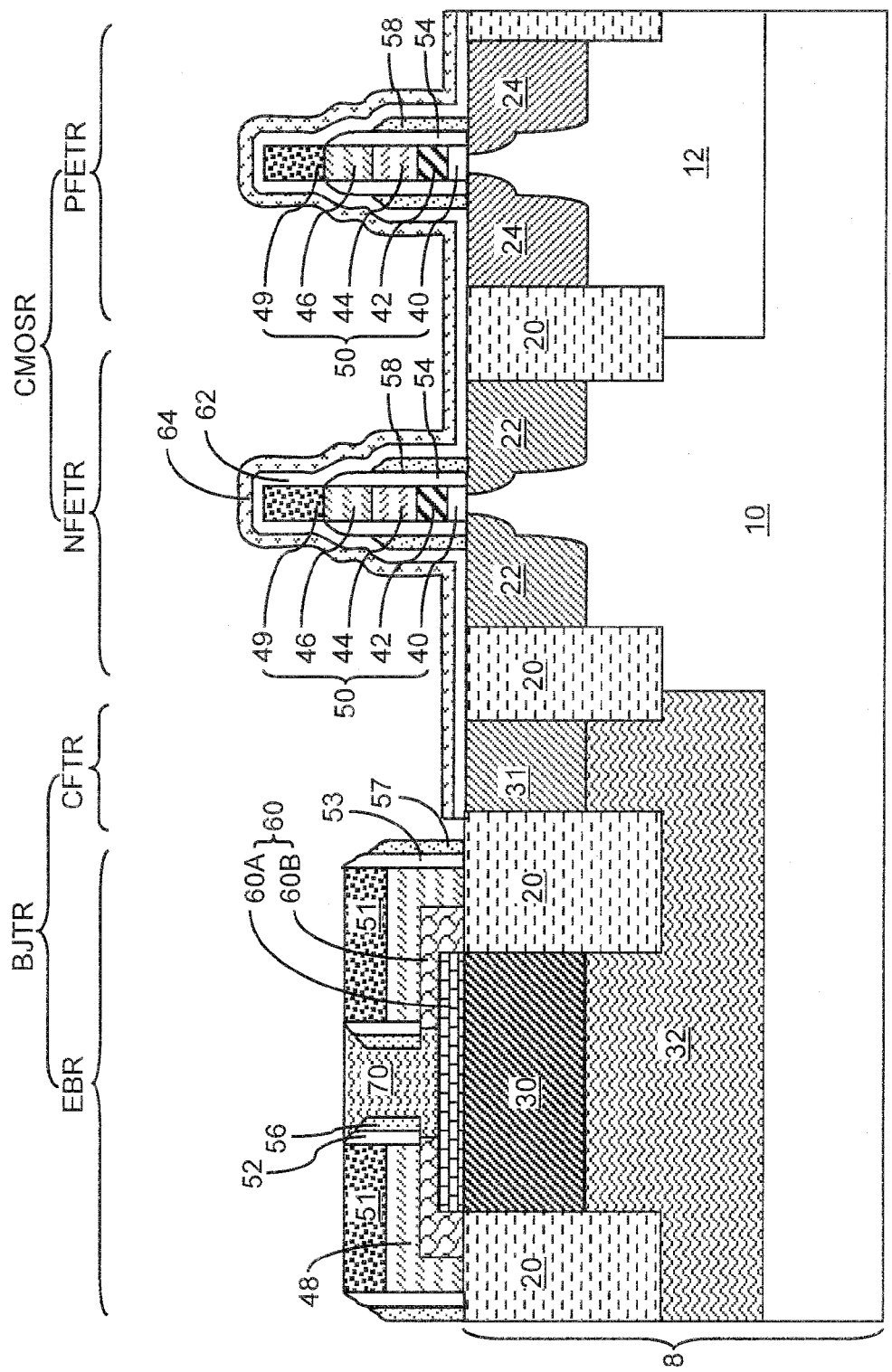
FIG. 14 is a vertical cross-sectional view of the exemplary structure after a selective epitaxy that forms an emitter.

Referring to FIG. 14, another selective epitaxy is performed to form an emitter 70 by selectively depositing a semiconductor material having a doping of the first conductivity type directly on the surface of the epitaxial base 60A. The emitter 70 contacts the epitaxial base 60A and the first polycrystalline extrinsic base portion 60B, but does not contact the second polycrystalline extrinsic base portion 48.

As in the selective epitaxy employed to grow the epitaxial base 60A, the selective epitaxy process employed for growing the emitter 70 deposits a semiconductor material only on semiconductor surfaces, i.e., only on the exposed surfaces of the epitaxial base 60A and the first polycrystalline extrinsic base portion 60B, but does not deposit any semiconductor material on dielectric surfaces. The emitter 70 fills the cavity 69. In one embodiment, the top surface of the emitter 70 may be substantially coplanar with the top surface of the dielectric cap material mesa portion 51.

In one embodiment, the emitter comprises an epitaxial semiconductor material having an epitaxial alignment with the epitaxial base 60A. In another embodiment, the emitter 70 comprises a polycrystalline semiconductor material.

Figure 15:
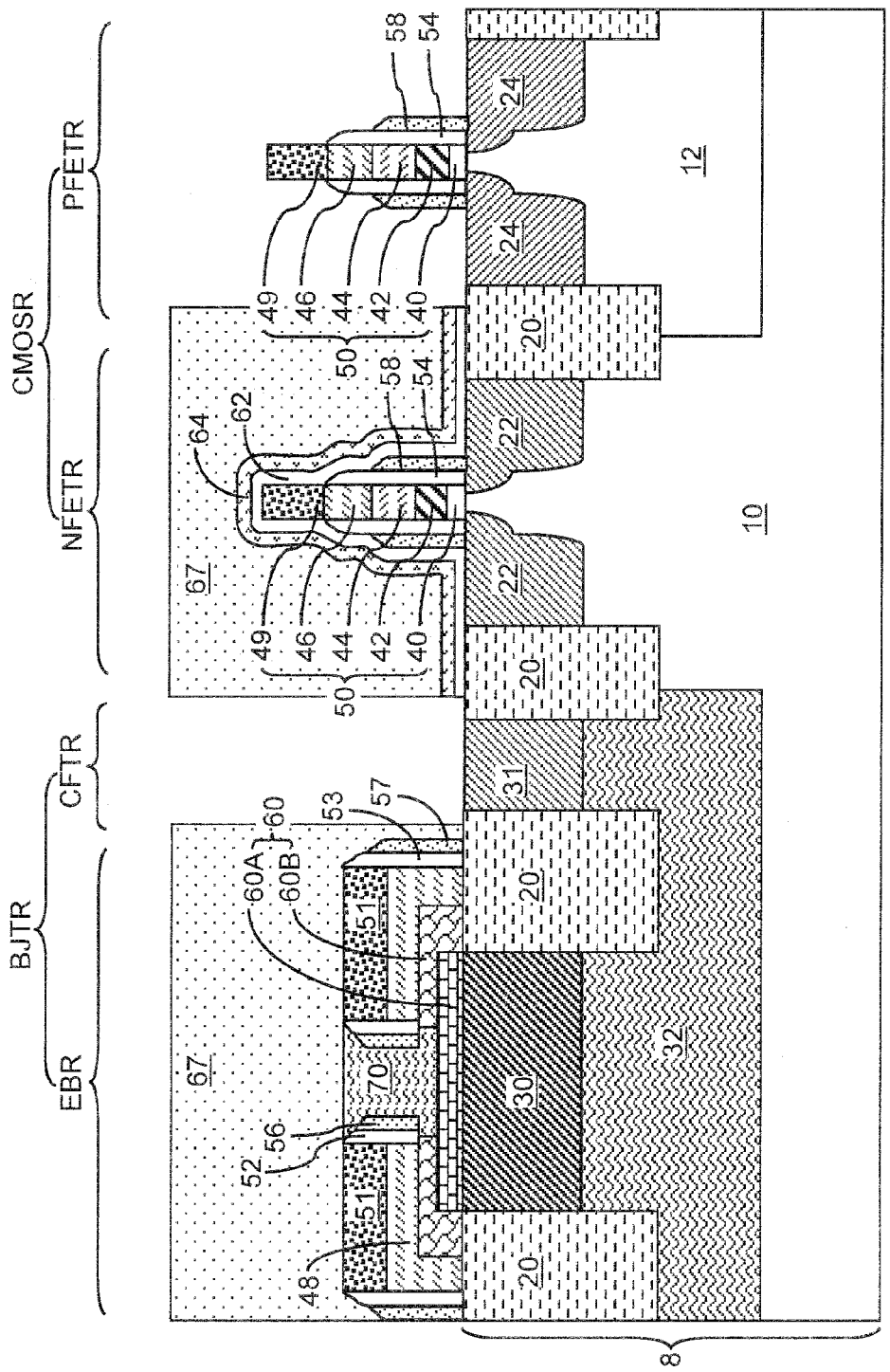
FIG. 15 is a vertical cross-sectional view of the exemplary structure after a second patterning of the buffer dielectric layer and the stress-generating layer.

Referring to FIG. 15, a sixth photoresist 67 is applied to the top surfaces of the exemplary semiconductor structure and lithographically patterned. The sixth photoresist 67 covers the emitter-base region EBR and the NFET region NFETR, but does not cover the collector feedthrough region CFTR or the PFET region PFETR. The portions of the stress-generating layer 64 and the buffer dielectric layer 62 in the collector feedthrough region CFTR or the PFET region PFETR are removed selective to the semiconductor material in the semiconductor substrate 8. The sixth photoresist 67 is subsequently removed. After removal of the sixth photoresist, the stress-generating layer 64 and the buffer dielectric layer 62 are present only in the NFET region NFETR.

Figure 16:
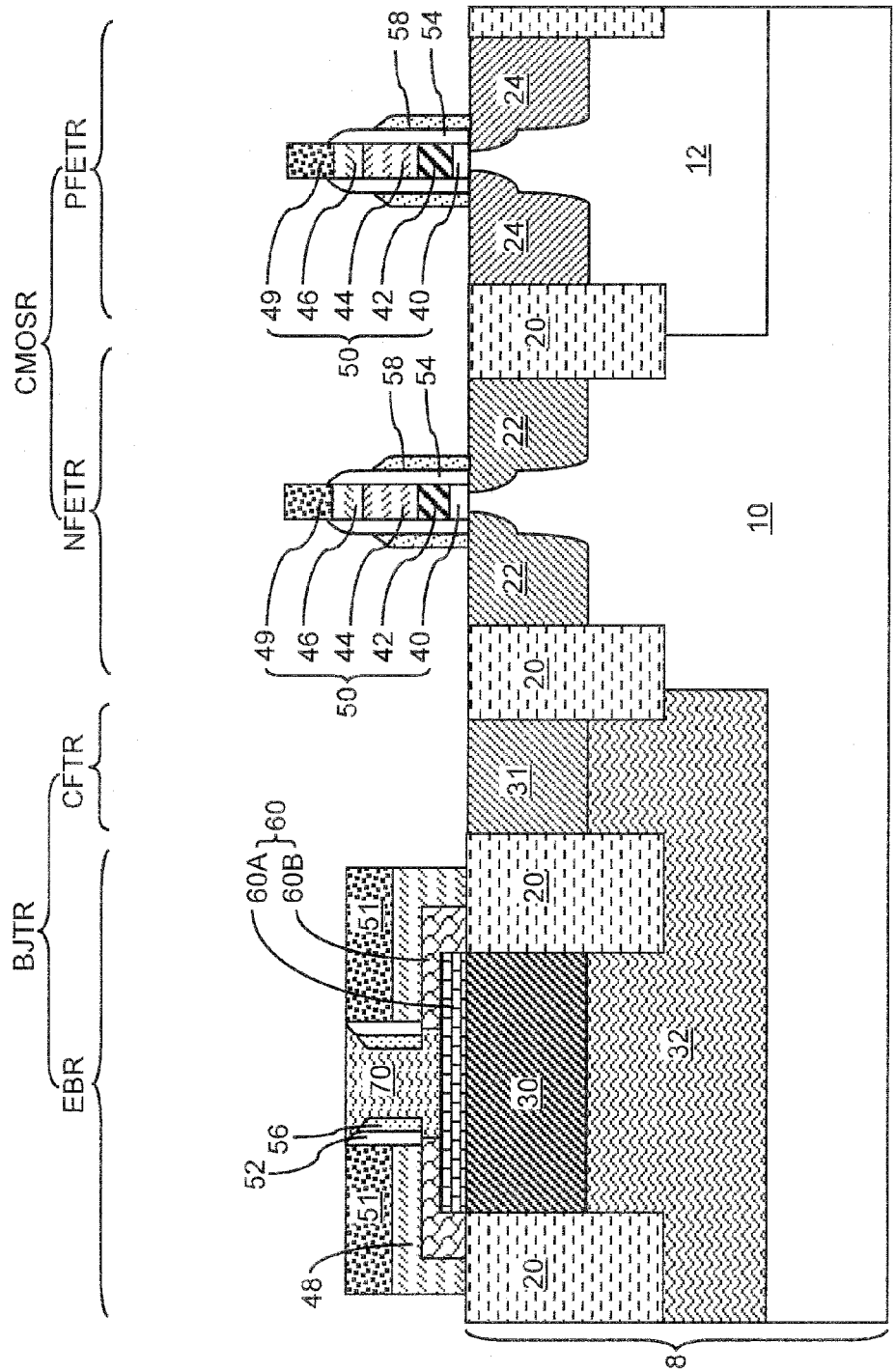
FIG. 16 is a vertical cross-sectional view of the exemplary structure after an activation anneal and the removal of the buffer dielectric layer and the stress-generating layer.

Referring to FIG. 16, an activation anneal is performed to induce memorization of external stress in the semiconductor material portion between the source and drain regions 22 of the first conductivity type in the NFET region NFETR. Stress memorization technology employs patterned portions of the stress-generating layer 64 and an activation anneal so that localized stress is permanently "memorized" locally within a semiconductor substrate. The stress-generating layer 64 and the buffer dielectric layer 62 are subsequently removed selective to the semiconductor material in the semiconductor substrate 8. Because the local stress is permanently memorized in the semiconductor material portion between the source and drain regions 22 of the first conductivity type in the NFET region NFETR, the localized stress, which is a tensile stress if the stress-generating layer 64 is a tensile-stress-generating dielectric material, remains in the channel of the n-type field effect transistor in the NFET region NFETR even after the removal of the stress-generating layer 64. Typically, the second outer spacer 57 is removed during the removal of the stress-generating layer 64, and the first outer spacer 53 is removed during the removal of the buffer dielectric layer 62.

Figure 17:
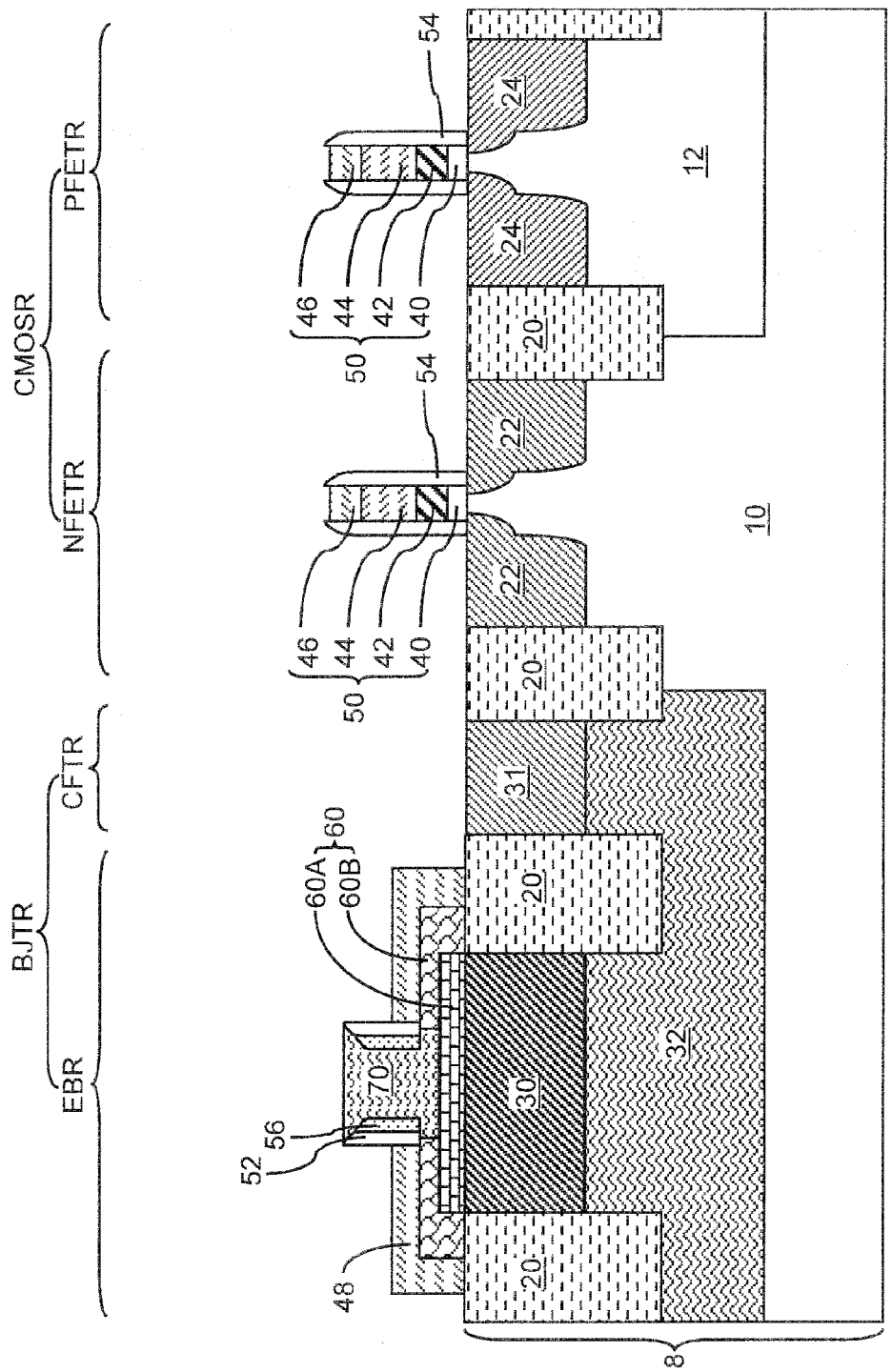
FIG. 17 is a vertical cross-sectional view of the exemplary structure after removal of gate dielectric caps and a dielectric cap material mesa portion.

Referring to FIG. 17, the dielectric gate caps 49 and the dielectric cap material mesa portion 51 are removed selective to the semiconductor materials in the semiconductor substrate 8, the emitter 70, and the second polycrystalline extrinsic base portion 48. In case the dielectric gate caps 49 and the dielectric cap material mesa portion 51 comprise silicon nitride, a wet etch in a hot phosphoric acid may be employed. In some embodiments, the second gate spacers 58 may be removed during the removal of the dielectric gate caps 49 and the dielectric cap material mesa portion 51.

Figure 18:
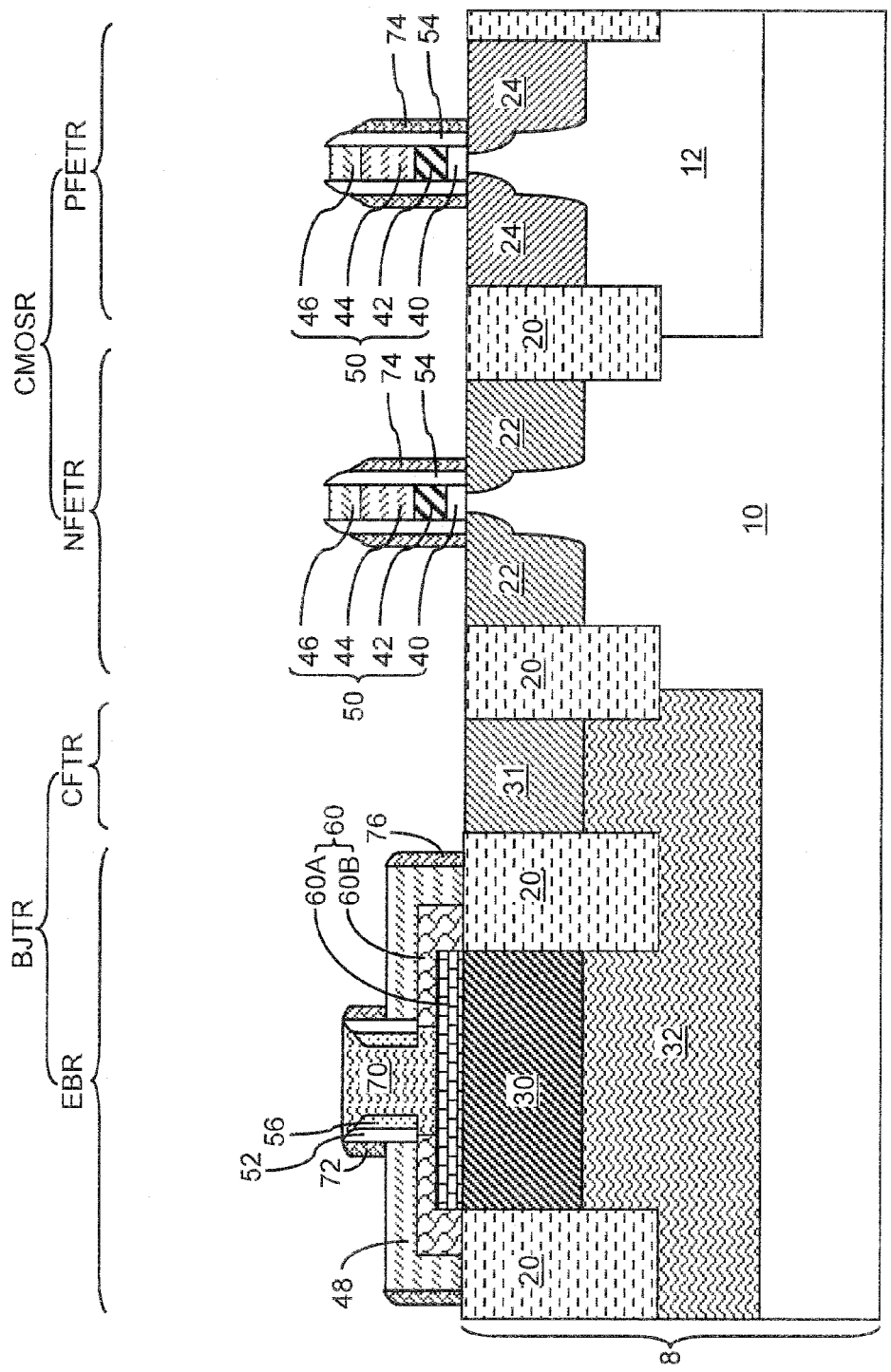
FIG. 18 is a vertical cross-sectional view of the exemplary structure after formation of an upper spacer, a lower spacer, and an outer gate spacer.

Referring to FIG. 18, yet another dielectric material layer may be deposited and anisotropically etched to form spacers on vertical surfaces of the exemplary semiconductor structure. For example, an upper spacer 72, a lower spacer 76, and outer gate spacers 74 may be formed. The upper spacer 72 and the lower spacer 76 are formed in the emitter-base region EBR, and constitute elements of the bipolar junction transistor structure. The upper spacer 72 contacts outer sidewalls of the first inner spacer 52, the lower spacer 76 contacts outer sidewalls of the second polycrystalline extrinsic base portion 76. Each of the outer gate spacers 74 contacts and laterally surrounds one of the first gate spacers 54. Outer gate spacers 74 are formed in the NFET region NFETR or in the PFET region PFETR, and constitute elements of MOS transistors. The upper spacer 72, the lower spacer 76, and the outer gate spacer 74 comprise a second dielectric material and have a second lateral width. The second dielectric material may be silicon nitride, and the second lateral width may be from 10 nm to 100 nm, although lesser and greater lateral widths may also be employed.

Figure 19:
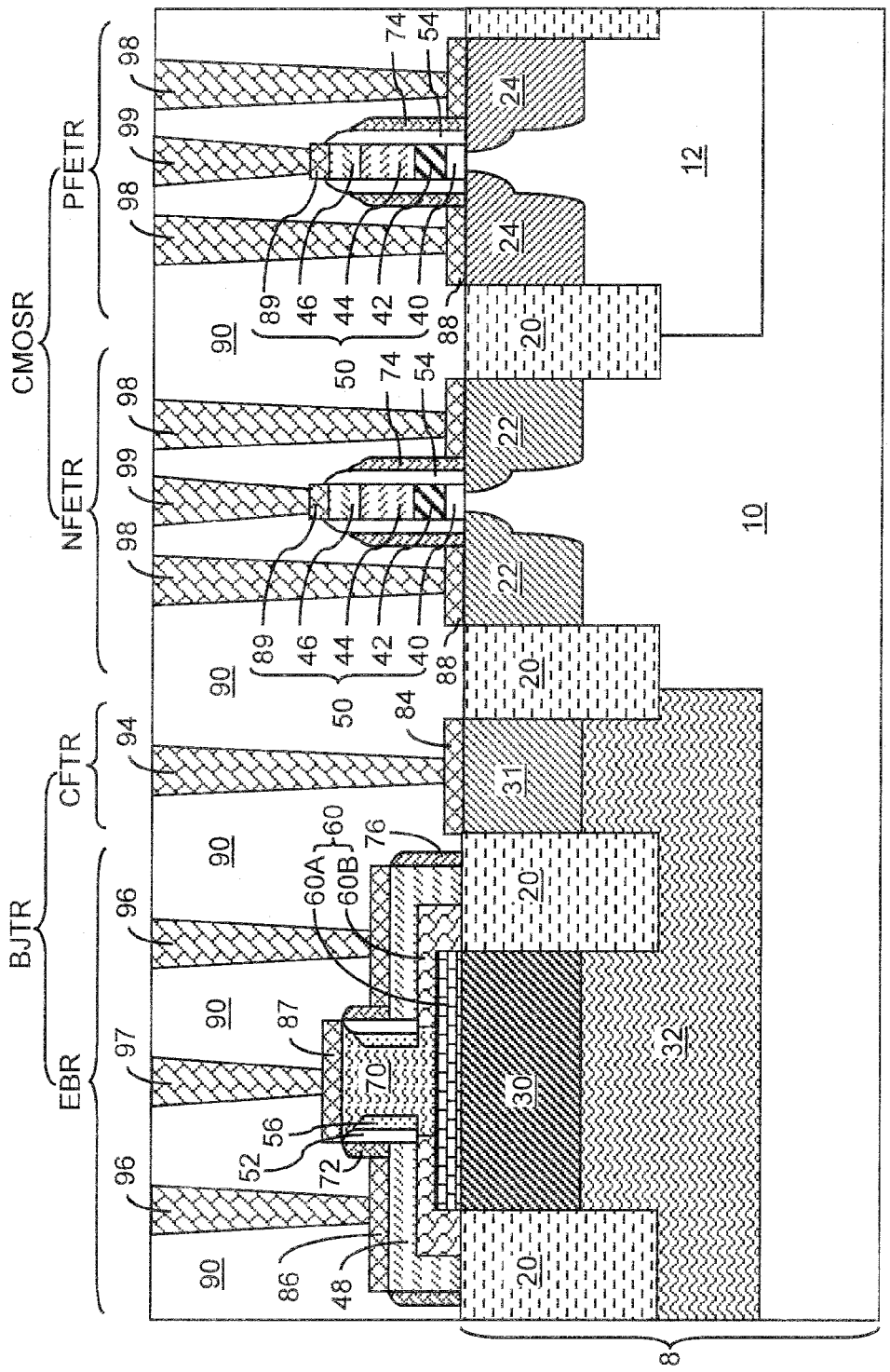
FIG. 19 is a vertical cross-sectional view of the exemplary structure after formation of a middle-of-line (MOL) dielectric layer and contact vias.

Referring to FIG. 19, various metal-semiconductor alloy regions, a middle-of-line (MOL) dielectric layer 90 and contact vias are formed. The various metal-semiconductor alloy regions may include an emitter metal-semiconductor alloy region 87, a base metal-semiconductor alloy region 86, a collector metal-semiconductor alloy region 84, gate metal-semiconductor alloy regions 89, and source and drain metal-semiconductor alloy regions 88. The various metal-semiconductor alloy region may be a metal silicide, a metal germanide, a metal germano-silicide, or any alloy of an underlying semiconductor material and a metal.

A middle-of-line (MOL) dielectric layer 90 comprising a dielectric material is deposited over the various metal-semiconductor alloy regions. The MOL dielectric layer 90 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 90 may be from 200 nm to 500 nm. The MOL dielectric layer 90 may also include a mobile ion diffusion barrier layer (not shown) that prevents diffusion of mobile ions into the semiconductor substrate 8. The mobile ion diffusion barrier layer may comprise silicon nitride. The MOL dielectric layer 90 is preferably planarized, for example, by chemical mechanical polishing (CMP).

Various contact via holes are formed in the MOL dielectric layer 90 and filled with metal to form various contact vias. The various contact vias are formed on the various metal-semiconductor alloy regions. For example, the various contact vias may include an emitter contact via 97, at least one base contact via 96, a collector contact via 94, gate contact vias 99, and source and drain contact vias 98.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
    at least one metal-oxide-semiconductor (MOS) transistor located on a first portion of a semiconductor substrate, said at least one MOS transistor including a high dielectric constant (high-k) gate dielectric having a dielectric constant greater than 3.9; and
    a bipolar junction transistor (BJT) located on a second portion of said semiconductor substrate, said BJT including a collector located in said semiconductor substrate and laterally surrounded by at least one shallow trench isolation structure, an epitaxial base located on said collector, a first polycrystalline extrinsic base portion contacting an entirety of sidewalls of said epitaxial base, a second polycrystalline extrinsic base portion contacting an entirety of outer sidewalls of said first polycrystalline extrinsic base portion, and an emitter contacting said epitaxial base and said first polycrystalline extrinsic base portion but not contacting said second polycrystalline extrinsic base portion.

2. The semiconductor structure of claim 1, wherein each of said at least one MOS transistor includes a gate stack, and said gate stack includes at least one metal portion of a material that is selected from an elemental metal, a metallic alloy, a conductive metallic nitride, and a conductive metallic carbide.

3. The semiconductor structure of claim 1, wherein said BJT includes a first inner spacer laterally surrounding said emitter, and each of said MOS transistor includes a first gate spacer laterally surrounding a gate stack and contacting sidewalls of said gate stack, and wherein said first inner spacer and said first gate spacer comprise a first dielectric material and have a same first lateral width.

4. The semiconductor structure of claim 3, wherein said BJT further includes an upper spacer and a lower spacer, said upper spacer contacts outer sidewalls of said first inner spacer, said lower spacer contacts outer sidewalls of said second polycrystalline extrinsic base portion.

5. The semiconductor structure of claim 4, wherein each of said MOS transistor includes an outer gate spacer contacting sidewalls of said first gate spacer.

6. The semiconductor structure of claim 5, wherein said upper spacer, said lower spacer, and said outer gate spacer comprise a second dielectric material and have a second lateral width.

7. The semiconductor structure of claim 4, wherein a bottommost surface of said upper spacer is vertically spaced from a topmost surface of said first polycrystalline extrinsic base portion by a thickness of said second polycrystalline extrinsic base portion.

8. The semiconductor structure of claim 3, wherein inner sidewalls of said second polycrystalline extrinsic base portion contact a lower portion an outer sidewall of said first inner spacer.

9. The semiconductor structure of claim 8, wherein a bottom surface of said first inner spacer is vertically spaced from a top surface of said first polycrystalline extrinsic base portion by a thickness of said second polycrystalline extrinsic base portion.

10. The semiconductor structure of claim 9, wherein one of said at least one MOS transistor includes a gate stack, and said gate stack includes a semiconductor material portion that has a same thickness as, and a same composition as, said second polycrystalline extrinsic base portion.

11. The semiconductor structure of claim 8, wherein an inner sidewall of said first polycrystalline extrinsic base portion laterally protrudes inward from said outer sidewall of said first inner spacer.

12. The semiconductor structure of claim 3, wherein said BJT includes a second inner spacer that contact inner sidewalls of said first inner spacer and said emitter.

13. The semiconductor structure of claim 12, wherein a bottom surface of said second inner spacer is coplanar with a bottom surface of said first inner spacer.

14. The semiconductor structure of claim 1, wherein one of said at least one MOS transistor includes a gate stack, and said gate stack includes said high-k gate dielectric and a semiconductor material portion that has a same thickness as, and a same composition as, said second polycrystalline extrinsic base portion.

15. The semiconductor structure of claim 14, wherein said gate stack further includes a metal portion in contact with said high-k gate dielectric, another semiconductor material portion in contact with said metal portion, and said semiconductor material portion.

16. The semiconductor structure of claim 1, wherein said BJT includes a subcollector and a subcollector feedthrough, said subcollector contacts said collector, said subcollector feedthrough contacts said subcollector, and bottom portions of source and drain regions of one of said at least one MOS transistor have a same doping as said subcollector feedthrough.

17. The semiconductor structure of claim 1, wherein said first polycrystalline extrinsic base portion and said second polycrystalline extrinsic base portion comprise different semiconductor materials.

18. The semiconductor structure of claim 17, wherein said first polycrystalline extrinsic base portion and said epitaxial base comprise a same semiconductor material.

19. The semiconductor structure of claim 18, wherein said first polycrystalline extrinsic base portion and said epitaxial base comprise a doped silicon germanium alloy.

20. The semiconductor structure of claim 19, wherein said second polycrystalline extrinsic base portion is a semiconductor material that is different from said doped silicon germanium alloy.

* * * * *